United States Patent
Yoda

(10) Patent No.: US 11,290,670 B2
(45) Date of Patent: Mar. 29, 2022

(54) IMAGING APPARATUS

(71) Applicant: SONY SEMICONDUCTOR SOLUTIONS CORPORATION, Kanagawa (JP)

(72) Inventor: Koji Yoda, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/967,622

(22) PCT Filed: Nov. 5, 2018

(86) PCT No.: PCT/JP2018/040937
§ 371 (c)(1),
(2) Date: Aug. 5, 2020

(87) PCT Pub. No.: WO2019/159444
PCT Pub. Date: Aug. 22, 2019

(65) Prior Publication Data
US 2021/0281794 A1  Sep. 9, 2021

(30) Foreign Application Priority Data

Feb. 15, 2018 (JP) .............................. JP2018-024888

(51) Int. Cl.
H04N 5/3745 (2011.01)
H04N 5/378 (2011.01)
(Continued)

(52) U.S. Cl.
CPC ... *H04N 5/37455* (2013.01); *H01L 27/14612* (2013.01); *H04N 5/3454* (2013.01); *H04N 5/378* (2013.01)

(58) Field of Classification Search
CPC .. H04N 5/37455; H04N 5/378; H04N 5/3454; H01L 27/14612
See application file for complete search history.

(56) References Cited

U.S. PATENT DOCUMENTS 7,565,033 B2 * 7/2009 Hanson ................ H04N 3/1593
382/304
8,564,705 B2 * 10/2013 Cieslinski .............. H04N 5/378
348/302

(Continued)

FOREIGN PATENT DOCUMENTS

CN 1909596 A 2/2007
EP 3253047 A1 12/2017
(Continued)

OTHER PUBLICATIONS

International Search Report and Written Opinion of PCT Application No. PCT/JP2018/040937, dated Jan. 22, 2019, 10 pagesof ISRWO.

Primary Examiner — Lin Ye
Assistant Examiner — Chriss S Yoder, III
(74) Attorney, Agent, or Firm — Chip Law Group

(57) ABSTRACT

Output control is separately performed on pixels corresponding to a plurality of different regions (ROIs) in the entire region of an imaging element. An imaging element that captures an image of a subject includes first and second pixels. First and second analog-to-digital converters convert pixel signals from the first and second pixels from an analog value to a digital value. A first switch supplies a pixel signal from the first pixel to any one of the first and second analog-to-digital converters. A second switch supplies a pixel signal from the second pixel to any one of the first and second analog-to-digital converters.

7 Claims, 17 Drawing Sheets

(51) Int. Cl.
*H01L 27/146* (2006.01)
*H04N 5/345* (2011.01)

(56) References Cited

U.S. PATENT DOCUMENTS

| | | | |
|---|---|---|---|
| 10,506,184 B2 * | 12/2019 | Kato | H04N 5/3742 |
| 2006/0268137 A1 | 11/2006 | Myers | |
| 2008/0246867 A1 * | 10/2008 | Sugai | H04N 5/3745 |
| | | | 348/302 |
| 2017/0302869 A1 | 10/2017 | Ikuma et al. | |

FOREIGN PATENT DOCUMENTS

| | | |
|---|---|---|
| GB | 2426883 A | 12/2006 |
| JP | 2006-340358 A | 12/2006 |
| JP | 2008-172609 A | 7/2008 |
| JP | 2013-055589 A | 3/2013 |
| JP | 2013-255035 A | 12/2013 |
| KR | 10-2006-0125552 A | 12/2006 |
| WO | 2016/121352 A1 | 8/2016 |

* cited by examiner

IMAGING APPARATUS

CROSS REFERENCE TO RELATED APPLICATIONS

This application is a U.S. National Phase of International Patent Application No. PCT/JP2018/040937 filed on Nov. 5, 2018, which claims priority benefit of Japanese Patent Application No. JP 2018-024888 filed in the Japan Patent Office on Feb. 15, 2018. Each of the above-referenced applications is hereby incorporated herein by reference in its entirety.

TECHNICAL FIELD

The present technology relates to an imaging apparatus. More specifically, the present technology relates to an imaging apparatus including an analog-to-digital converter for every column of a plurality of pixels.

BACKGROUND ART

There is known a column analog-to-digital convertor (ADC) system for converting a pixel signal into a digital value, by providing an analog-to-digital converter for every column of pixels in an imaging element that captures an image of a subject. In this column ADC method, an imaging apparatus has been proposed in which a plurality of analog-to-digital converters is provided for every column of pixels, and different exposure times, gain settings, and the like are set for every path of the ADC (for example, see Patent Document 1).

CITATION LIST

Patent Document

Patent Document 1: Japanese Patent Application Laid-Open No. 2013-55589

SUMMARY OF THE INVENTION

Problems to be Solved by the Invention

In the related art described above, by providing a plurality of analog-to-digital converters for every column of pixels, it is possible to set different exposure times, gain settings, and the like for every path of the ADC. Meanwhile, in recent years, in performing image processing or the like, processing may be performed by focusing on a specific region in an image, and the region is called a region of interest (ROI). In the conventional technology described above, the entire region of a pixel array is targeted, and it is insufficient to perform region control on a plurality of partial regions.

The present technology has been created in view of such a situation, and an object thereof is to separately perform output control on pixels corresponding to a plurality of different regions in the entire region of an imaging element.

Solutions to Problems

The present technology has been made to solve the problems described above, and a first aspect thereof is an imaging apparatus including: first and second pixels of an imaging element configured to capture an image of a subject; first and second analog-to-digital converters configured to convert a pixel signal from the above-described first and second pixels from an analog value to a digital value; a first switch configured to supply a pixel signal from the above-described first pixel to any one of the above-described first and second analog-to-digital converters; and a second switch configured to supply a pixel signal from the above-described second pixel to any one of the above-described first and second analog-to-digital converters. Therefore, an effect is provided that the first and second pixels are supplied to any one of the first and second analog-to-digital converters by the first and second switches.

Furthermore, in this first aspect, the above-described first pixel may correspond to a first region, the above-described second pixel may correspond to a second region that at least partially overlaps with the above-described first region in a column direction, the above-described first switch may supply a pixel signal of the above-described first pixel to the above-described first analog-to-digital converter, and the above-described second switch may supply a pixel signal of the above-described second pixel to the above-described second analog-to-digital converter. Therefore, an effect is provided that, in a case where the first and second pixels correspond to different regions, pixel signals thereof are individually supplied to different first or second analog-to-digital converters.

Furthermore, this first aspect may further includes: third and fourth pixels of the above-described imaging element; a third switch configured to supply a pixel signal from the above-described third pixel to the above-described first analog-to-digital converter in a case where the above-described third pixel corresponds to the above-described first region, and supply a pixel signal from the above-described third pixel to the above-described second analog-to-digital converter in a case where the above-described third pixel corresponds to the above-described second region; and a fourth switch configured to supply a pixel signal from the above-described fourth pixel to the above-described first analog-to-digital converter in a case where the above-described fourth pixel corresponds to the above-described first region, and supply a pixel signal from the above-described fourth pixel to the above-described second analog-to-digital converter in a case where the above-described fourth pixel corresponds to the above-described second region. Therefore, an effect is provided that the third and fourth switches are respectively provided for the third and fourth pixels, and pixel signals thereof are supplied to the first or second analog-to-digital converter. Furthermore, in this case, there may be provided a plurality of imaging circuits including the above-described first to fourth pixels, the above-described first and second analog-to-digital converters, and the above-described first to fourth switches. Therefore, an effect is provided that reading is performed simultaneously by the plurality of imaging circuits.

Furthermore, this first aspect may further include third and fourth pixels of the above-described imaging element, in which the above-described first switch may supply a pixel signal from the above-described third pixel to the above-described first analog-to-digital converter in a case where the above-described third pixel corresponds to the above-described first region, and supply a pixel signal from the above-described third pixel to the above-described second analog-to-digital converter in a case where the above-described third pixel corresponds to the above-described second region, and the above-described second switch may supply a pixel signal from the above-described fourth pixel to the above-described first analog-to-digital converter in a case where the above-described fourth pixel corresponds to the above-described first region, and supply a pixel signal from the above-described fourth pixel to the above-described second analog-to-digital converter in a case where the above-described fourth pixel corresponds to the above-described second region. Therefore, an effect is provided that pixel signals of the third and fourth pixels are supplied to the first or second analog-to-digital converter via the first and second switches, respectively. Furthermore, in this case, there may be provided a plurality of imaging circuits including the above-described first to fourth pixels, the above-described first and second analog-to-digital converters, and the above-described first and second switches. Therefore, an effect is provided that reading is performed simultaneously by the plurality of imaging circuits.

Furthermore, this first aspect may further include: a first flip-flop configured to hold a first digital signal outputted from the above-described first analog-to-digital converter; and a second flip-flop configured to hold a second digital signal outputted from the above-described second analog-to-digital converter. Therefore, an effect is provided that the first and second digital signals outputted from the first and second analog-to-digital converters are held by the first and second flip-flops.

Furthermore, this first aspect may further include an output switch configured to select the above-described first and second digital signals held by the above-described first and second flip-flops to be outputted to any one of first and second output units. Therefore, an effect of outputting a pixel signal of a predetermined region is provided.

Furthermore, in this first aspect, the above-described first pixel may correspond to a first region, the above-described second pixel may correspond to a second region that at least partially overlaps with the above-described first region in a column direction, the above-described first switch may supply a pixel signal of the above-described first pixel to the above-described first analog-to-digital converter, the above-described second switch may supply a pixel signal of the above-described second pixel to the above-described second analog-to-digital converter, and the above-described output switch may output a first digital signal outputted from the above-described first analog-to-digital converter to the above-described first output unit, and output a second digital signal outputted from the above-described second analog-to-digital converter to the above-described second output unit. Therefore, an effect of outputting pixel signals of a plurality of regions is provided.

Effects of the Invention

According to the present technology, an excellent effect can be produced that output control can be separately performed on pixels corresponding to a plurality of different regions in the entire region of an imaging element. Note that the effects described herein are not necessarily limited, and any of the effects described in the present disclosure is possible.

MODE FOR CARRYING OUT THE INVENTION

Hereinafter, embodiments for implementing the present technology (hereinafter, referred to as embodiments) will be described. The description will be made in the following order.

1. First embodiment (example of region control in 1×1 pixel units)
2. Second embodiment (example of region control in 2×2 pixel units)
3. Modified example
4. Application example 1. First Embodiment

[Configuration of Imaging Apparatus]

Figure 1:
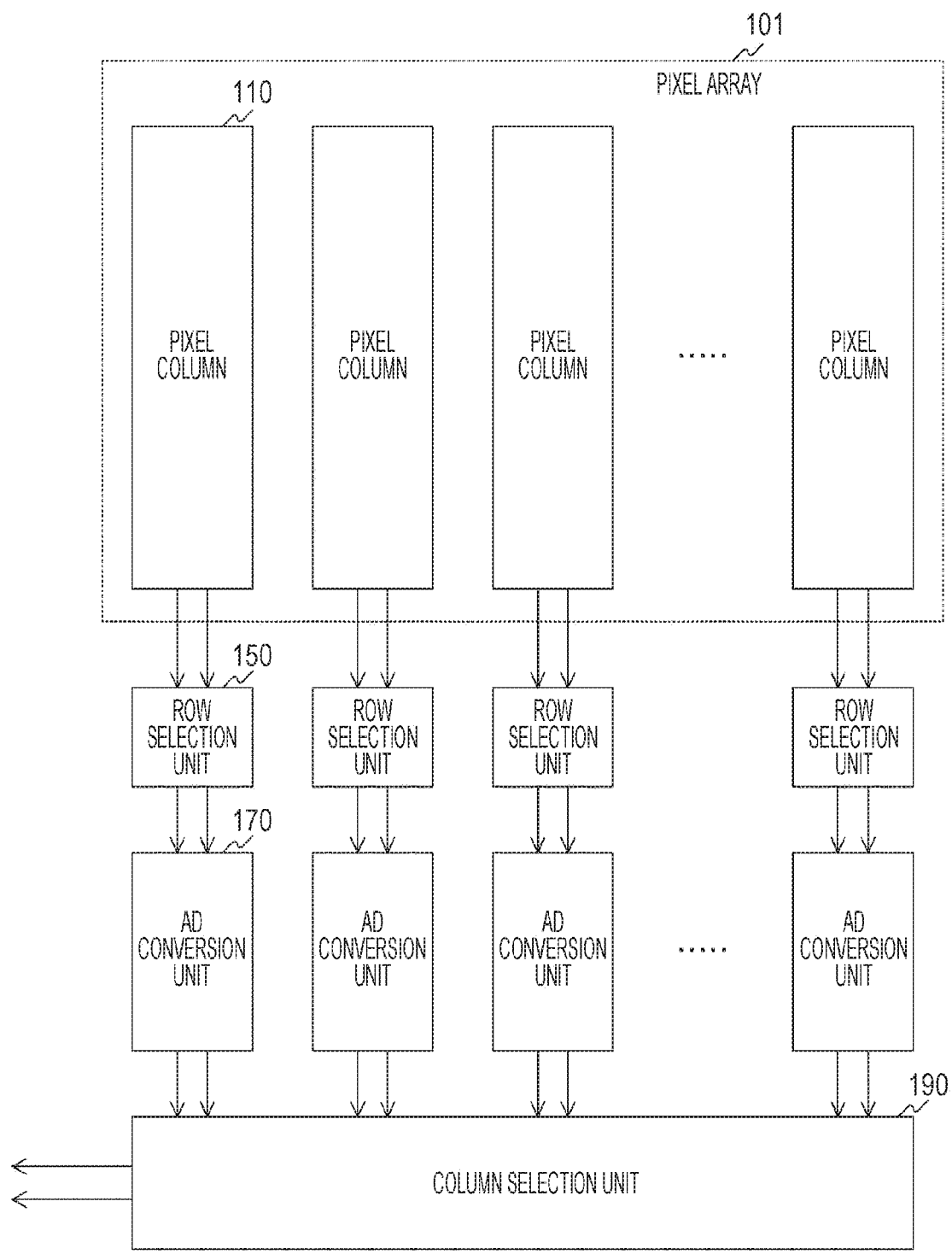
FIG. 1 is a diagram illustrating a configuration example of an imaging apparatus according to an embodiment of the present technology.

FIG. 1 is a diagram illustrating a configuration example of an imaging apparatus according to a first embodiment of the present technology. The imaging apparatus according to the present embodiment includes: a pixel array 101 including a plurality of pixel columns 110; a row selection unit 150 and an AD conversion unit 170 corresponding to each of the pixel columns 110; and a column selection unit 190.

The pixel column 110 is a pixel group of an imaging element that captures an image of a subject. In the pixel array 101, pixels are arranged in an array (matrix), and a pixel group obtained by dividing the pixels for every column is referred to as the pixel column 110.

The AD conversion unit 170 is to perform conversion (AD conversion) from an analog signal to a digital signal, for a pixel signal selected by the corresponding row selection unit 150. Each of the AD conversion units 170 includes a plurality of AD converters (ADCs), and can simultaneously perform AD conversion on a plurality of pixel signals.

The row selection unit 150 is to select pixel signals of a predetermined row from among pixel signals from pixels in the corresponding pixel column 110. Each of the row selection units 150 can simultaneously select a plurality of rows of pixel signals, and connects the selected pixel signals to any of the plurality of AD converters of the AD conversion unit 170.

The column selection unit 190 is to hold pixel signals based on digital signals outputted from the AD conversion unit 170, and select and output pixel signals of a predetermined column from among these pixel signals. This column selection unit 190 can hold a plurality of pixel signals for every column.

Figure 2:
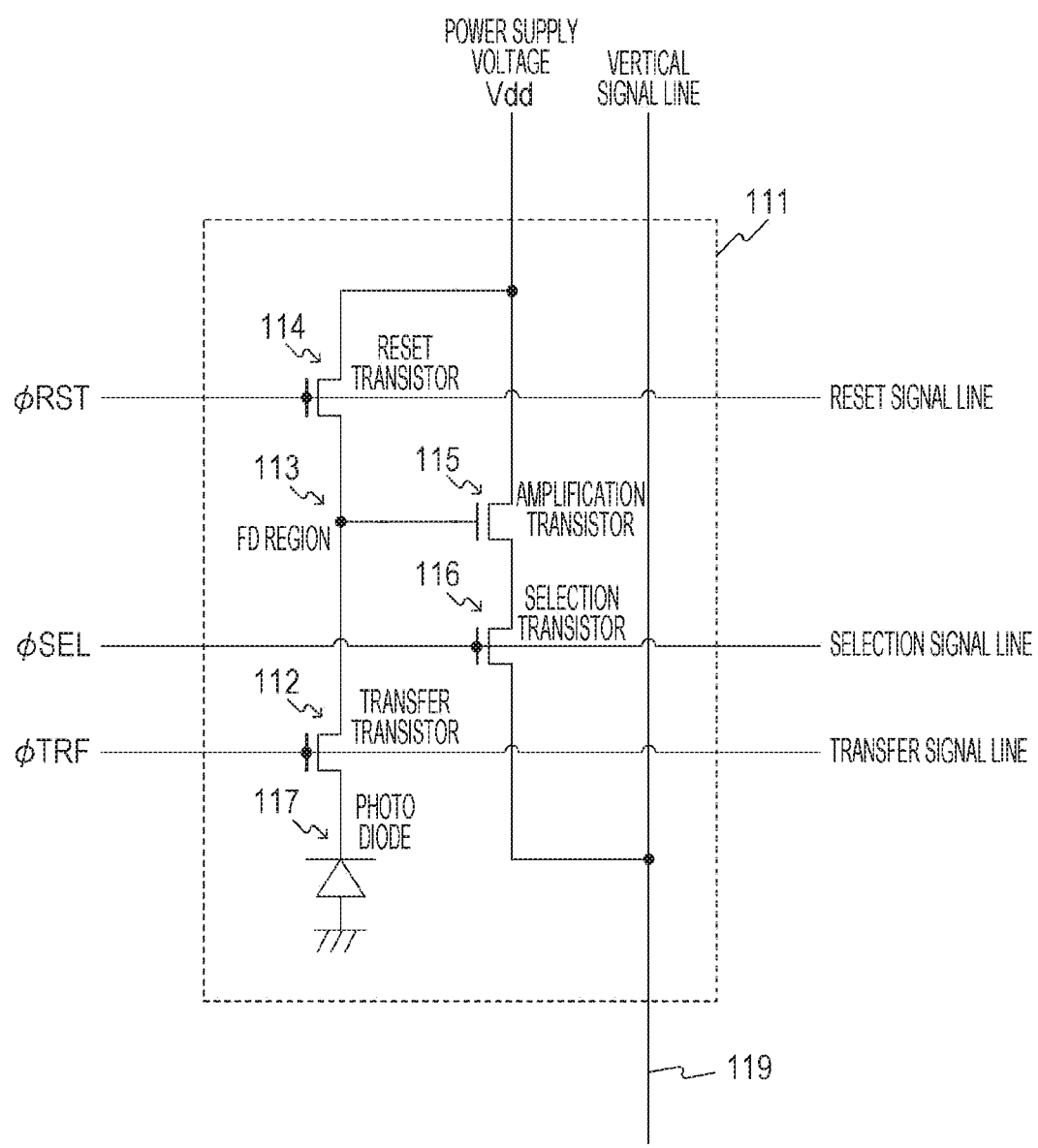
FIG. 2 is a diagram illustrating a configuration example of a pixel circuit according to an embodiment of the present technology.

FIG. 2 is a diagram illustrating a configuration example of a pixel circuit according to an embodiment of the present technology. Pixels in the pixel column 110 can be configured by, for example, a complementary metal oxide semiconductor (CMOS) image sensor, a charge coupled device (CCD) image sensor, or the like. Here, an example of a pixel circuit using a CMOS image sensor will be described.

A pixel 111 includes a photo diode 117, a transfer transistor 112, a floating diffusion region 113, a reset transistor 114, an amplification transistor 115, and a selection transistor 116. These four transistors, which are the transfer transistor 112, the reset transistor 114, the amplification transistor 115, and the selection transistor 116, are called pixel transistors. Note that, in this example, it is assumed that the pixel transistor is a MOS transistor having an N-type carrier polarity.

Furthermore, for the pixel 111, three signal lines, which are a transfer signal line, a reset signal line, and a selection signal line, are provided in a row direction, and a vertical signal line 119 is provided in a column direction. Furthermore, a power supply voltage Vdd is supplied to a drain side of the reset transistor 114 and the amplification transistor 115.

The photo diode (PD) 117 is a photoelectric conversion unit that generates an electric charge according to incident light. Note that an anode of this photo diode 117 is grounded.

The transfer transistor 112 is a transistor that transfers charges generated in the photo diode 117. This transfer transistor 112 is provided between a cathode of the photo diode 117 and the floating diffusion region 113. This transfer transistor 112 is turned on when a high-level signal is inputted through the transfer signal line connected to a gate thereof, and transfers charges photoelectrically converted in the photo diode 117 to the floating diffusion region 113.

The floating diffusion (FD) region 113 is a diffusion layer region that converts charges transferred by the transfer transistor 112 into a voltage signal. The voltage signal of this floating diffusion region 113 is connected to a drain of the reset transistor 114 and a gate of the amplification transistor 115.

The reset transistor 114 is a transistor that is for resetting a voltage of the floating diffusion region 113. This reset transistor 114 is provided between the power supply voltage Vdd and the floating diffusion region 113. This reset transistor 114 is turned on when a high-level signal is inputted to the reset signal line connected to a gate thereof, and resets a potential of the floating diffusion region 113 to the power supply voltage Vdd.

The amplification transistor 115 is a transistor that amplifies a voltage signal of the floating diffusion region 113. The gate of the amplification transistor 115 is connected to the floating diffusion region 113. A drain of the amplification transistor 115 is connected to the power supply voltage Vdd, and a source of the amplification transistor 115 is connected to the vertical signal line 119 via the selection transistor 116. This amplification transistor 115 amplifies a voltage signal of the floating diffusion region 113 and outputs the amplified signal to the selection transistor 116 as a pixel signal.

The selection transistor 116 is a transistor that is for selecting this pixel. This selection transistor 116 is provided between the amplification transistor 115 and the vertical signal line 119. This selection transistor 116 is turned on when a high-level signal is inputted to the selection signal line connected to a gate thereof, and outputs a voltage signal amplified by the amplification transistor 115 to the vertical signal line 119.

Figure 3:
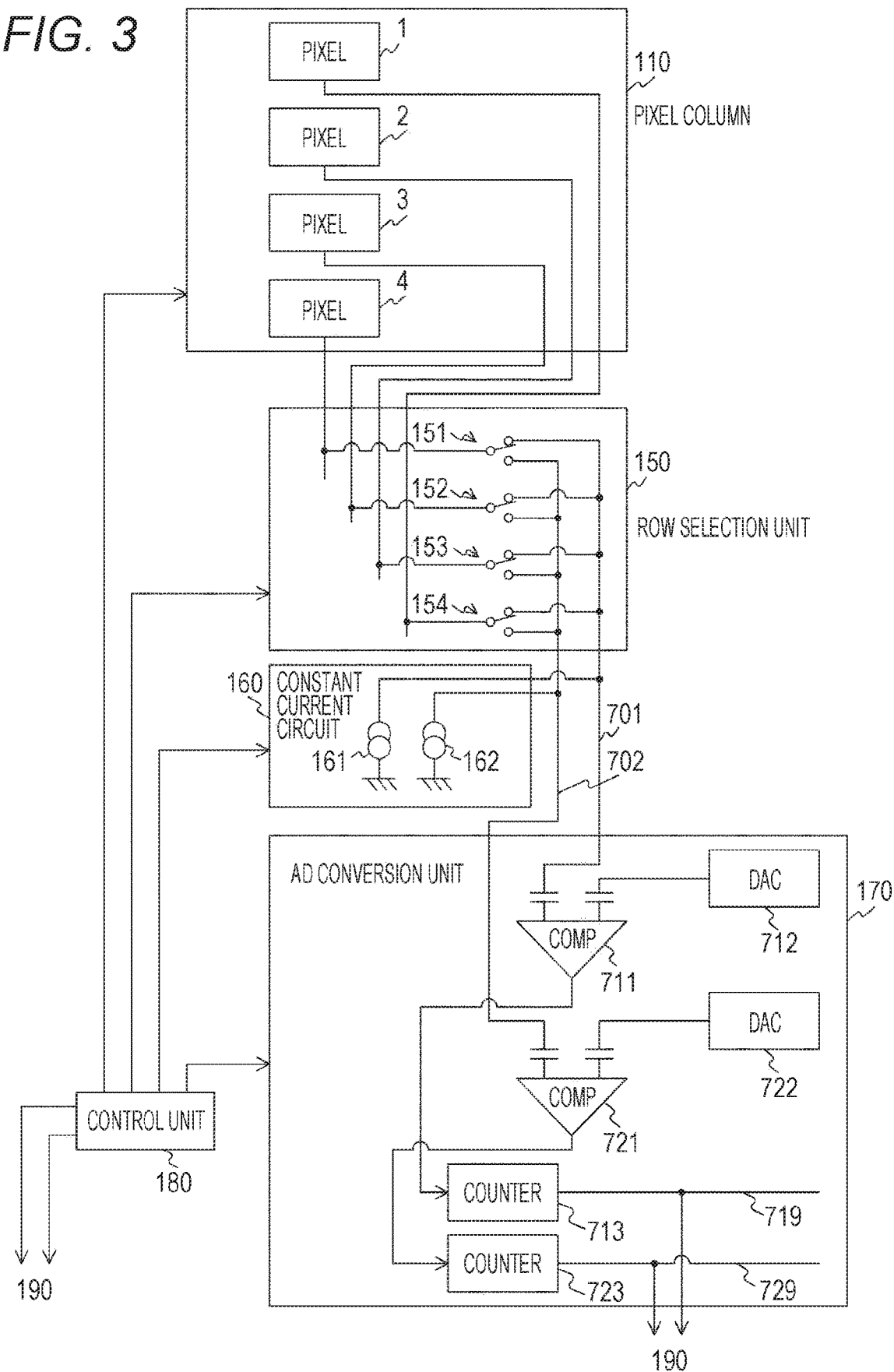
FIG. 3 is a diagram illustrating a configuration example of a unit column of an imaging apparatus according to a first embodiment of the present technology.

FIG. 3 is a diagram illustrating a configuration example of a unit column of an imaging apparatus according to the first embodiment of the present technology.

Here, four pixels 1 to 4 in the pixel column 110 are shown. The row selection unit 150 includes a plurality of switches 151 to 154 corresponding to the pixels 1 to 4 in the pixel column 110. The switches 151 to 154 are switches that perform switching so as to connect image signals from the pixels 1 to 4 to any of vertical signal lines 701 and 702.

A constant current circuit 160 includes constant current sources 161 and 162 connected to the vertical signal lines 701 and 702, respectively. These constant current sources 161 and 162 are to supply a current necessary for reading pixel signals from the pixels 1 to 4.

The AD conversion unit 170 includes comparators 711 and 721, DA converters 712 and 722, and counters 713 and 723. The DA converters 712 and 722 are to supply a ramp signal for AD conversion. Note that it is assumed in this example that each of the AD conversion units 170 includes the DA converters 712 and 722, but it is possible to configure to share a ramp signal between columns without providing the DA converters 712 and 722.

The comparators 711 and 721 are respectively connected to the vertical signal lines 701 and 702, and compare the pixel signals from the pixels 1 to 4 with a ramp signal. The counters 713 and 723 are counters that count comparison results of the comparators 711 and 721. The comparators 711 and 721 and the counters 713 and 723 individually form a single slope column ADC.

Hereinafter, the comparator 711 and the counter 713 will be referred to as an ADC 171, and the comparator 721 and the counter 723 will be referred to as an ADC 172. That is, in this example, the ADC 171 is connected to the vertical signal line 701, and the ADC 172 is connected to the vertical signal line 702. That is, each of the switches 151 to 154 of the row selection unit 150 connects the selected pixel signal to any of the ADCs 171 and 172. An output of the ADC 171 is supplied to a signal line 719, and an output of the ADC 172 is supplied to a signal line 729. These outputs are supplied to the column selection unit 190.

A control unit 180 is connected to the pixel columns 110, the row selection unit 150, the constant current circuit 160, the AD conversion unit 170, and the column selection unit 190 in the imaging apparatus, and is to control the entire imaging apparatus.

Figure 4:
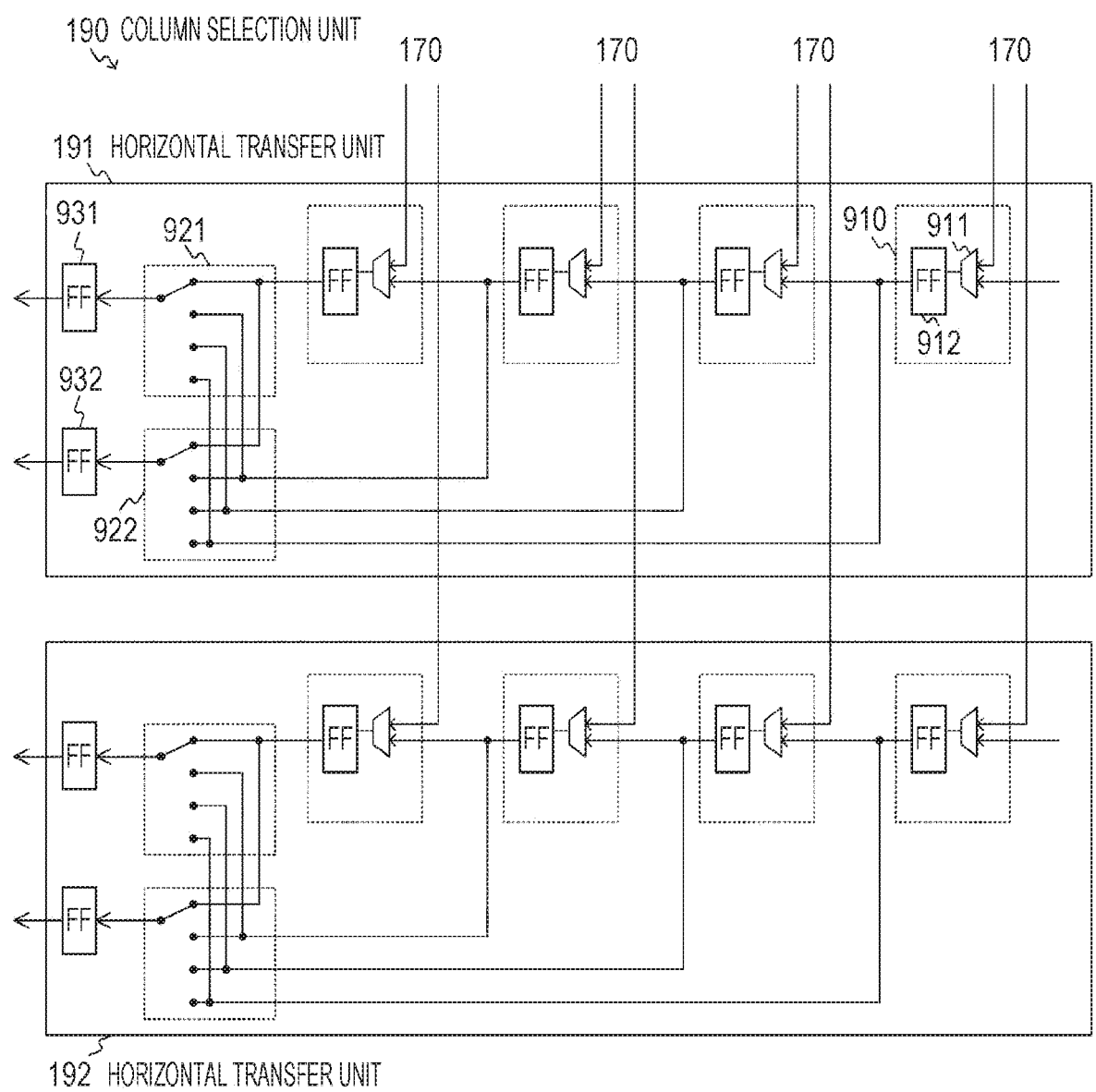
FIG. 4 is a diagram illustrating a configuration example of a column selection unit 190 according to the first embodiment of the present technology.

FIG. 4 is a diagram illustrating a configuration example of the column selection unit 190 according to the first embodiment of the present technology.

This column selection unit 190 includes two horizontal transfer units 191 and 192 having the same configuration. The horizontal transfer unit 191 corresponds to the ADC 171 while the horizontal transfer unit 192 corresponds to the ADC 172. Therefore, operations of the two paths can be performed simultaneously and in parallel. Each of the horizontal transfer units 191 and 192 includes a plurality of pixel signal holding units 910 corresponding to every column, column selection switches 921 and 922, and output holding units 931 and 932.

The pixel signal holding unit 910 is to hold a pixel signal from the AD conversion unit 170 in each column. This pixel signal holding unit 910 includes an input selector 911 and a flip-flop 912. The input selector 911 is to select any of a pixel signal from the corresponding AD conversion unit 170 and a pixel signal shifted from the pixel signal holding unit 910 in a preceding stage, and input to the flip-flop 912. This input selector 911 selects a signal from the AD conversion unit 170 when fetching a pixel signal from the AD conversion unit 170, and selects a signal from the pixel signal holding unit 910 in the preceding stage when performing a shift operation in the row direction. The flip-flop 912 is to hold a pixel signal inputted from the input selector 911.

The column selection switches 921 and 922 are to select pixel signals of a predetermined column from among the pixel signals held by the plurality of pixel signal holding units 910. In each of the horizontal transfer units 191 or 192, these column selection switches 921 and 922 select any one pixel signal, with a pixel signal held by all corresponding pixel signal holding units 910 as an input.

The output holding units 931 and 932 are to hold and output the pixel signals selected by the column selection switches 921 and 922. The output holding unit 931 corresponds to the column selection switch 921, while the output holding unit 932 corresponds to the column selection switch 922.

[Operation of Imaging Apparatus]

Figure 5:
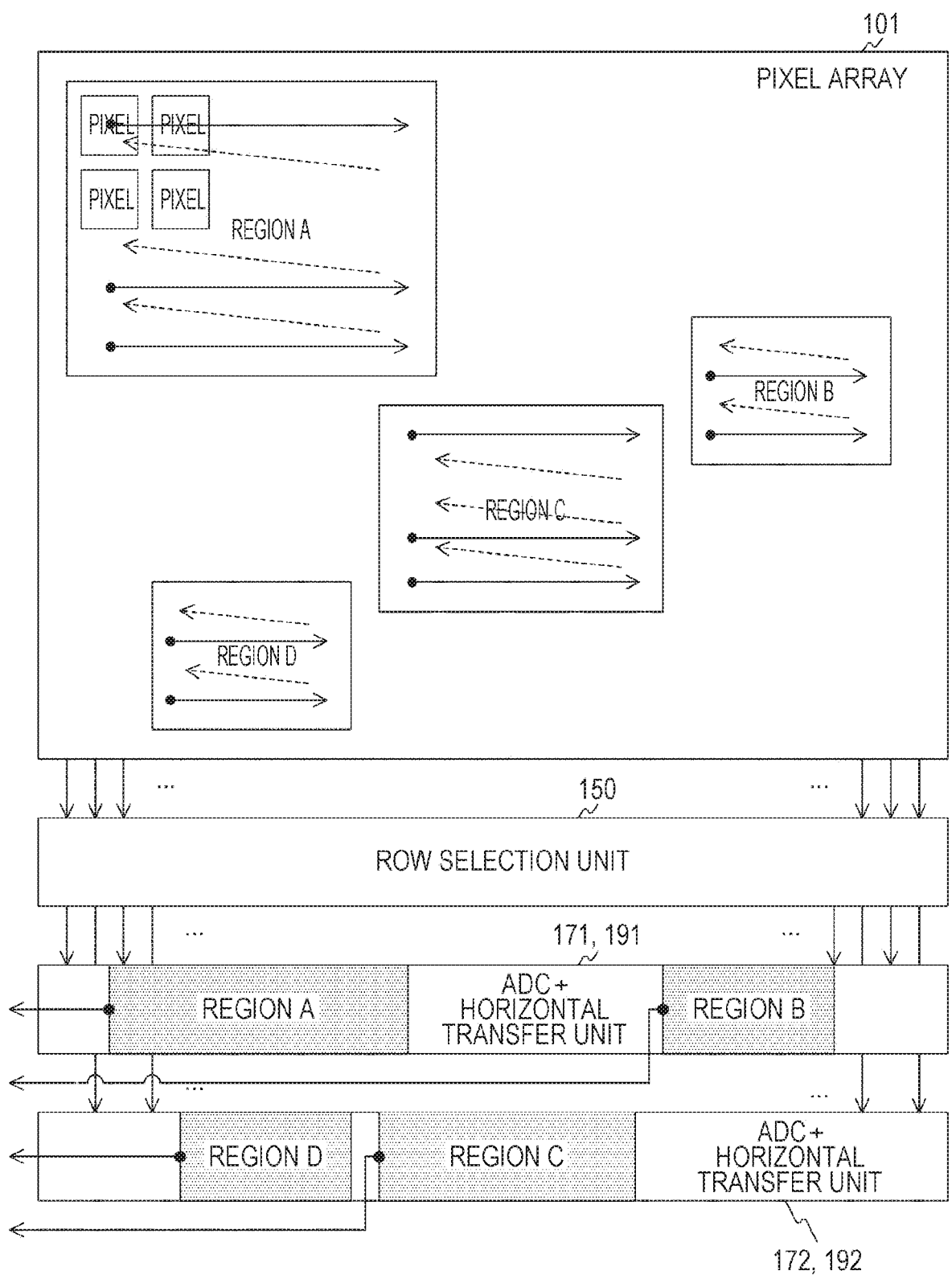
FIG. 5 is a diagram illustrating an example of an operation outline of the imaging apparatus according to the first embodiment of the present technology.

FIG. 5 is a diagram illustrating an example of an operation outline of the imaging apparatus according to the first embodiment of the present technology.

Here, it is assumed that there are four regions, which are a region A, a region B, a region C, and a region D, as partial regions of the entire region of the pixel array 101. In each region, a scanning operation for reading pixel signals is performed independently. This example shows a state in which pixels are scanned from left to right and from bottom to top in the region. This is similar to an order of normal raster scan in a case where the image is mapped on an image sensor via a lens.

From the pixel signals scanned in the pixel array 101, a predetermined row is selected by the row selection unit 150 for every pixel column as described above, and is supplied to the AD conversion unit 170 and the column selection unit 190. Here, it is assumed that two paths are provided, the ADC 171 and the horizontal transfer unit 191, and ADC 172 and the horizontal transfer unit 192.

The ADC 171 and the horizontal transfer unit 191 fetch and output the pixel signals of the region A and the region B. Whereas, the ADC 172 and the horizontal transfer unit 192 fetch and output the pixel signals of the region C and the region D. Since the ADC 171 and the horizontal transfer unit 191, and the ADC 172 and the horizontal transfer unit 192 can operate independently, the pixel signals of the regions A and B and the pixel signals of the regions C and D can be processed independently. Furthermore, since the horizontal transfer unit 191 includes the two column selection switches 921 and 922, it is possible to independently output the pixel signals of the region A and the pixel signals of the region B. Similarly, the horizontal transfer unit 192 can independently output the pixel signals of the region C and the pixel signals of the region D.

Figure 6:
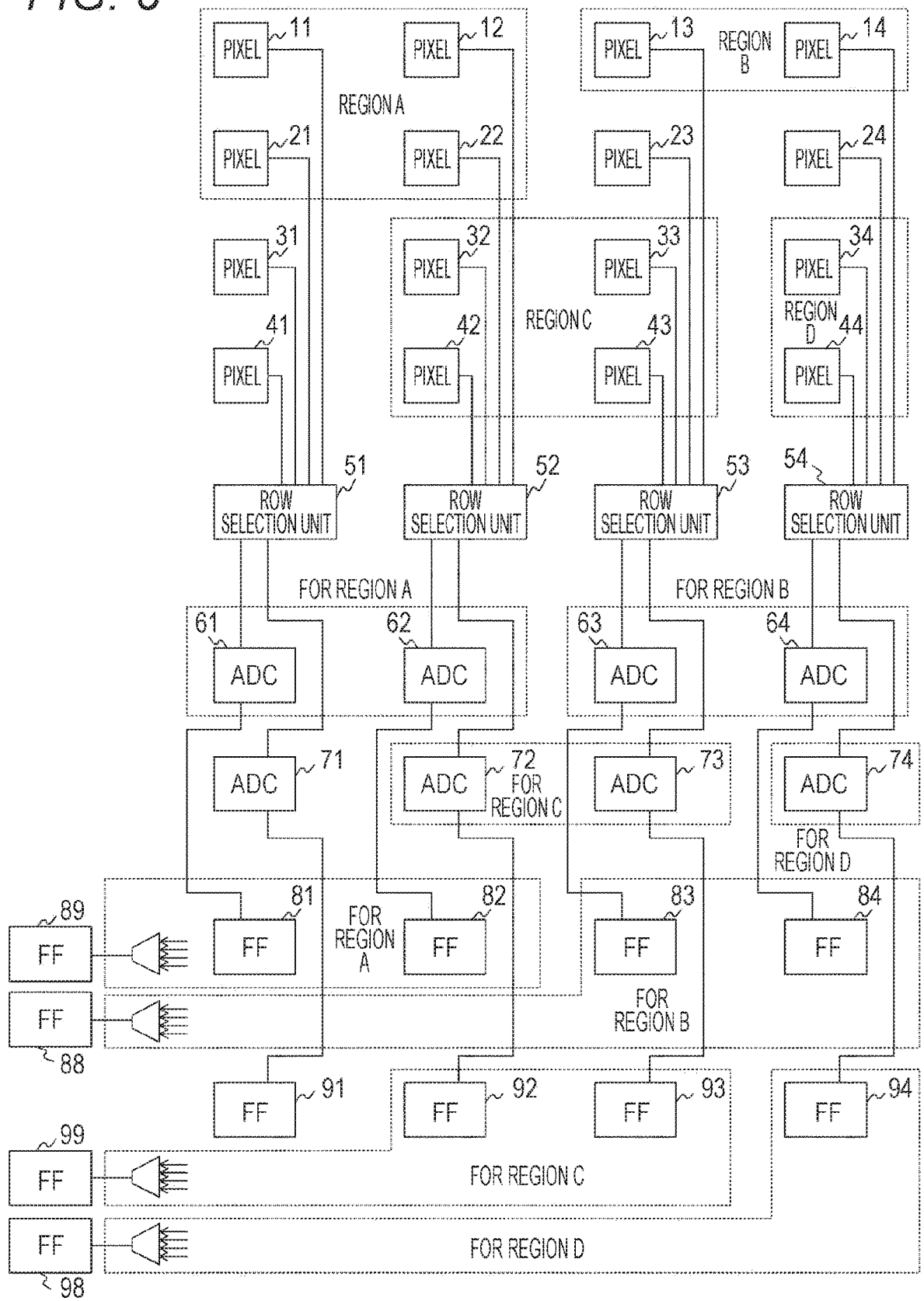
FIG. 6 is a diagram illustrating an example of a correspondence between the imaging apparatus and a region according to the first embodiment of the present technology.

FIG. 6 is a diagram illustrating an example of a correspondence between the imaging apparatus and a region according to the first embodiment of the present technology.

In this example, there is shown an example of assignment of each unit in a case where there are four regions A, B, C and D in a 4×4 pixel region. The region A is a region of four pixels of pixels 11, 12, 21, and 22. The region B is a region of two pixels 13 and 14. The region C is a region of four pixels 32, 33, 42, and 43. The region D is a region of two pixels of the pixels 34 and 44.

A row selection unit 51 is connected to a pixel column of pixels 11, 21, 31, and 41, and selects pixel signals of a predetermined row. A row selection unit 52 is connected to a pixel column of the pixels 12, 22, 32, and 42, and selects pixel signals of a predetermined row. A row selection unit 53 is connected to a pixel column of pixels 13, 23, 33, and 43, and selects pixel signals of a predetermined row. A row selection unit 54 is connected to a pixel column of pixels 14, 24, 34, and 44, and selects pixel signals of a predetermined row.

To the row selection unit 51, two paths of an ADC 61 and a flip-flop 81 and an ADC 71 and a flip-flop 91 are connected. To the row selection unit 52, two paths of an ADC 62 and a flip-flop 82 and an ADC 72 and a flip-flop 92 are connected. To the row selection unit 53, two paths of an ADC 63 and a flip-flop 83 and an ADC 73 and a flip-flop 93 are connected. To the row selection unit 54, two paths of an ADC 64 and a flip-flop 84 and an ADC 74 and a flip-flop 94 are connected.

The flip-flops 81 to 84 correspond to the horizontal transfer unit 191 described above. Furthermore, two column selection switches 88 and 89 connected to the flip-flops 81 to 84 correspond to the column selection switches 921 and 922 and the output holding units 931 and 932 in the horizontal transfer unit 191 described above. Similarly, the flip-flops 91 to 94 correspond to the horizontal transfer unit 192 described above, and two column selection switches 98 and 99 connected to the flip-flops 91 to 94 correspond to the column selection switches 921 and 922 and the output holding units 931 and 932 in the horizontal transfer unit 192 described above.

In this configuration, the region A is processed by the ADC 61 and the flip-flop 81, the ADC 62 and the flip-flop 82, and the column selection switch 89. Furthermore, the region B is processed by the ADC 63 and the flip-flop 83, the ADC 64 and the flip-flop 84, and the column selection switch 88. Furthermore, the region C is processed by the ADC 72 and the flip-flop 92, the ADC 73 and the flip-flop 93, and the column selection switch 99. Furthermore, the region D is processed by the ADC 74 and the flip-flop 94, and the column selection switch 98.

Figure 7:
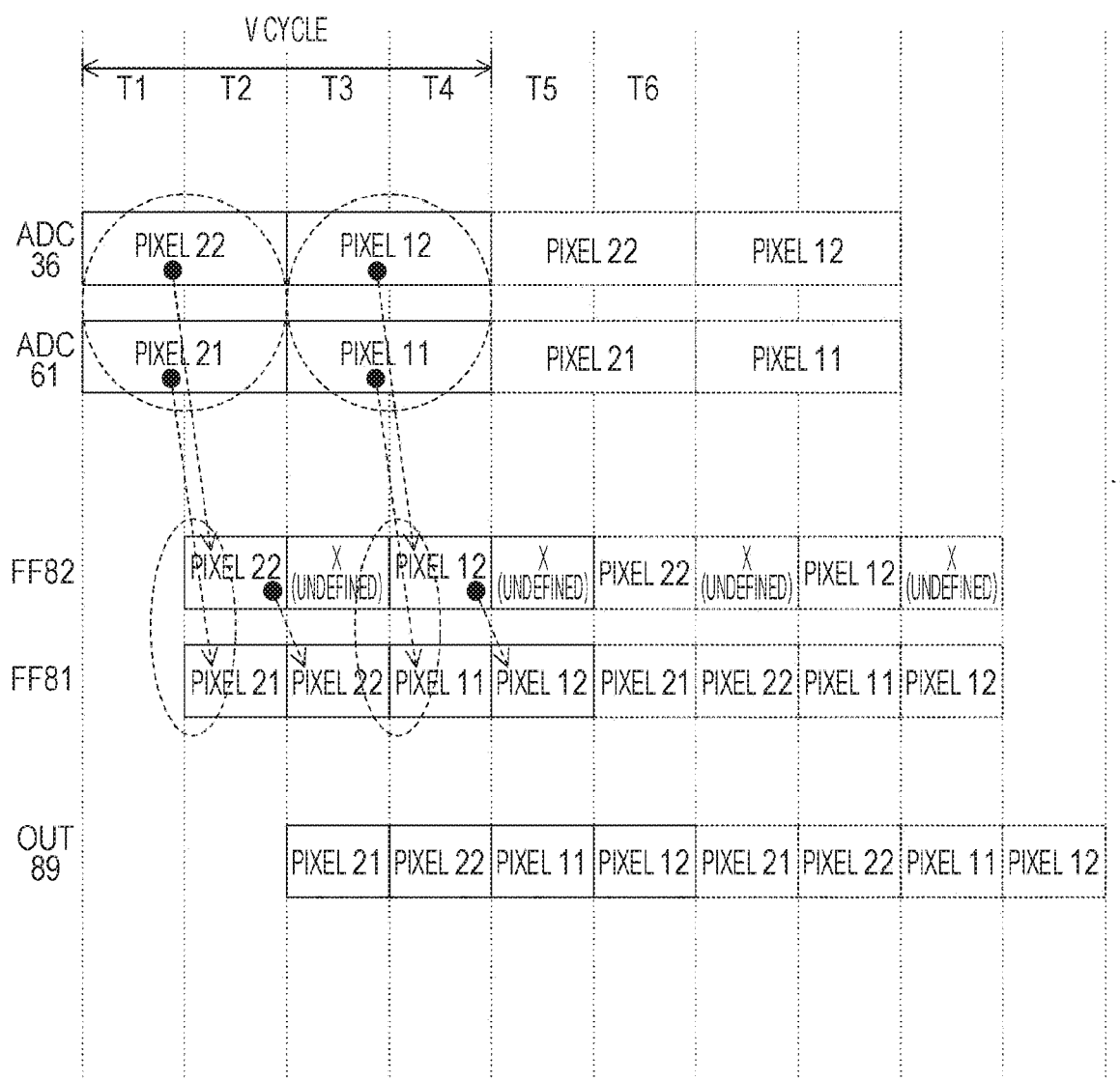
FIG. 7 is a view illustrating an example of processing timing of a region A according to the first embodiment of the present technology.

FIG. 7 is a view illustrating an example of processing timing of the region A according to the first embodiment of the present technology.

The region A is a region of four pixels, and requires four cycles as a vertical (V) cycle. First, at T1, a pixel signal of the pixel 21 is supplied to the ADC 61, and a pixel signal of the pixel 22 is supplied to the ADC 62. Then, at T2, the pixel signal of the pixel 21 is held by the flip-flop 81, and the pixel signal of the pixel 22 is held by the flip-flop 82. The pixel signal of the pixel 21 is selected and held by the column selection switch 89 at T3. The pixel signal of the pixel 22 is shifted and held by the flip-flop 81 at T3, and is selected and held by the column selection switch 89 at T4.

Furthermore, at T3, a pixel signal of the pixel 11 is supplied to the ADC 61, and a pixel signal of the pixel 12 is supplied to the ADC 62. Then, at T4, the pixel signal of the pixel 11 is held by the flip-flop 81, and the pixel signal of the pixel 12 is held by the flip-flop 82. The pixel signal of the pixel 11 is selected and held by the column selection switch 89 at T5. The pixel signal of the pixel 12 is shifted and held by the flip-flop 82 at T5, and is selected and held by the column selection switch 89 at T6.

Figure 8:
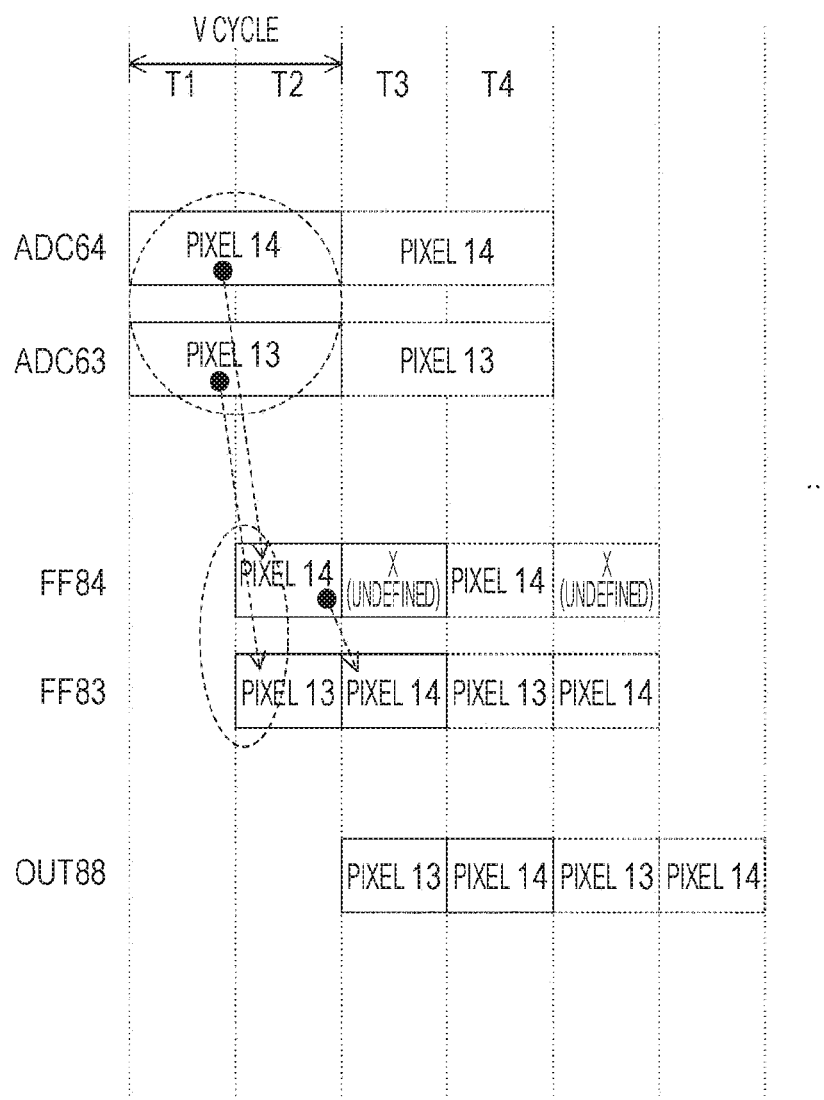
FIG. 8 is a view illustrating an example of processing timing of a region B according to the first embodiment of the present technology.

FIG. 8 is a view illustrating an example of processing timing of the region B according to the first embodiment of the present technology.

The region B is a region of two pixels, and requires two cycles as a vertical cycle. First, at T1, a pixel signal of the pixel 13 is supplied to the ADC 63, and a pixel signal of the pixel 14 is supplied to the ADC 64. Then, at T2, the pixel signal of the pixel 13 is held by the flip-flop 83, and the pixel signal of the pixel 14 is held by the flip-flop 84. The pixel signal of the pixel 13 is selected and held by the column selection switch 88 at T3. The pixel signal of the pixel 14 is shifted and held by the flip-flop 83 at T3, and is selected and held by the column selection switch 88 at T4.

Figure 9:
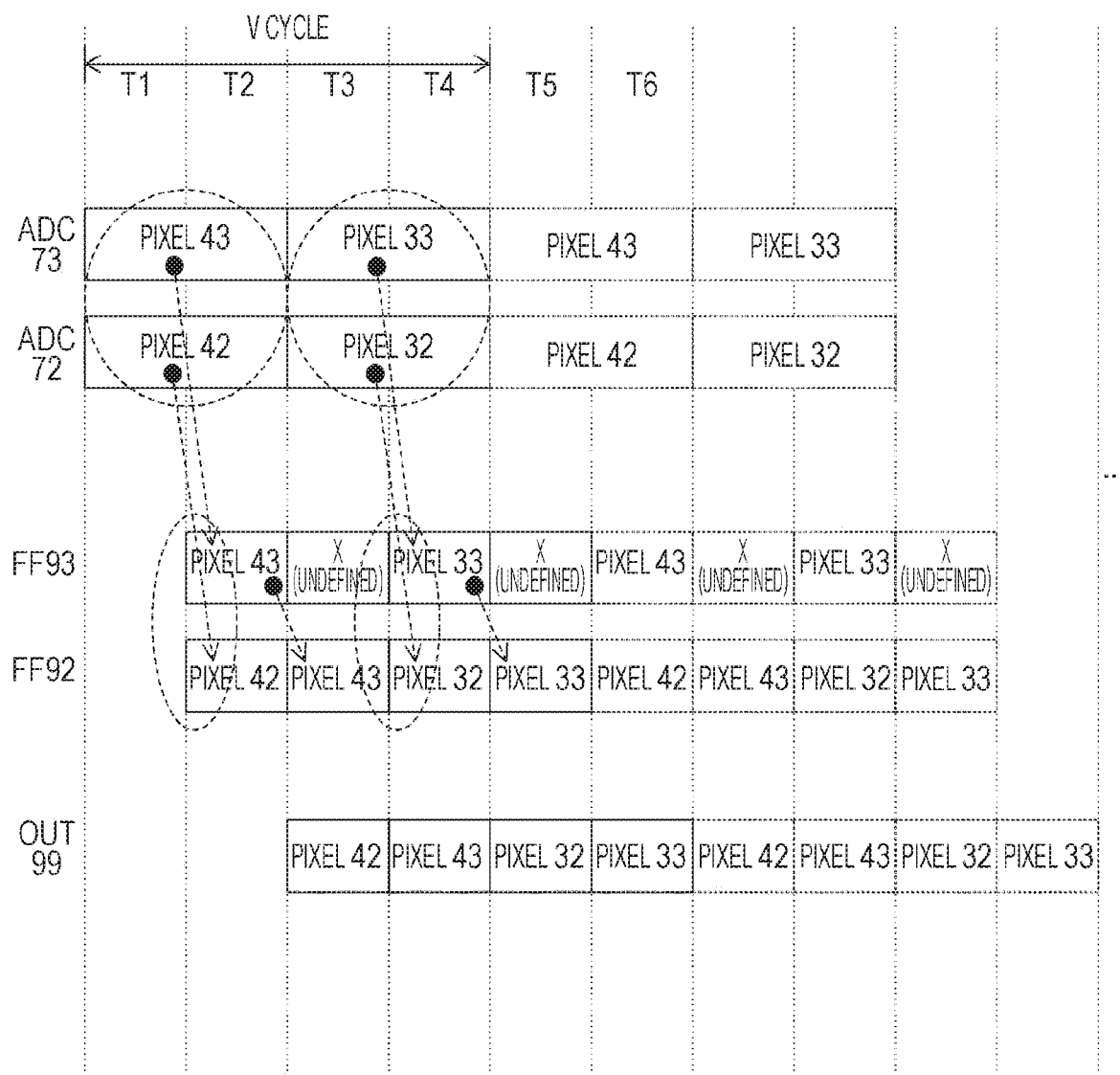
FIG. 9 is a view illustrating an example of processing timing of a region C according to the first embodiment of the present technology.

FIG. 9 is a view illustrating an example of processing timing of the region C according to the first embodiment of the present technology.

The region C is a region of four pixels, and requires four cycles as a vertical cycle. First, at T1, a pixel signal of the pixel 42 is supplied to the ADC 72, and a pixel signal of the pixel 43 is supplied to the ADC 73. Then, at T2, the pixel signal of the pixel 42 is held by the flip-flop 92, and the pixel signal of the pixel 43 is held by the flip-flop 93. The pixel signal of the pixel 42 is selected and held by the column selection switch 99 at T3. The pixel signal of the pixel 43 is shifted and held by the flip-flop 92 at T3, and is selected and held by the column selection switch 99 at T4.

Furthermore, at T3, a pixel signal of the pixel 32 is supplied to the ADC 72, and a pixel signal of the pixel 33 is supplied to the ADC 73. Then, at T4, the pixel signal of the pixel 32 is held by the flip-flop 92, and the pixel signal of the pixel 33 is held by the flip-flop 93. The pixel signal of the pixel 32 is selected and held by the column selection switch 99 at T5. The pixel signal of the pixel 33 is shifted and held by the flip-flop 93 at T5, and is selected and held by the column selection switch 99 at T6.

Figure 10:
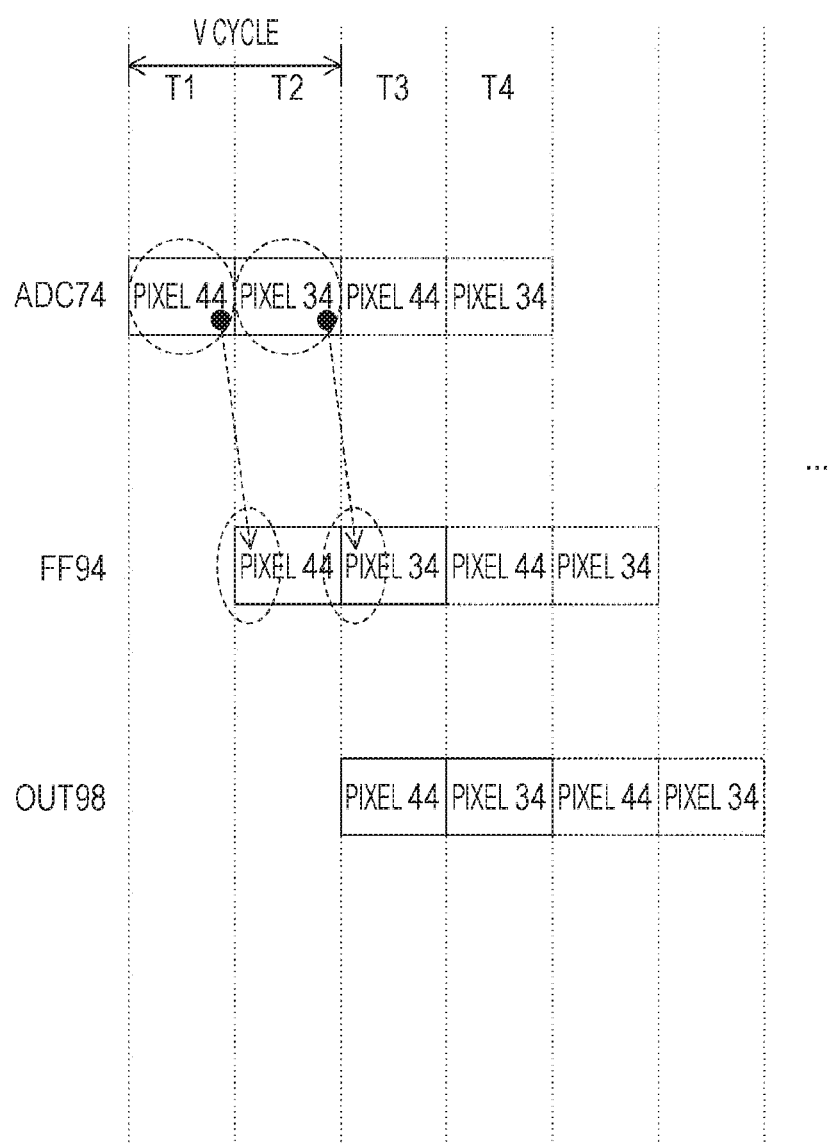
FIG. 10 is a view illustrating an example of processing timing of a region D according to the first embodiment of the present technology.

FIG. 10 is a view illustrating an example of processing timing of the region D according to the first embodiment of the present technology.

The region D is a region of two pixels, and requires two cycles as a vertical cycle. First, at T1, a pixel signal of the pixel 44 is supplied to the ADC 74. The pixel signal of the pixel 44 is held by the flip-flop 94 at T2. Then, the pixel signal of the pixel 44 is selected and held by the column selection switch 98 at T3.

At T2, a pixel signal of the pixel 34 is supplied to the ADC 74. The pixel signal of the pixel 34 is held by the flip-flop 94 at T3. Then, the pixel signal of the pixel 34 is selected and held by the column selection switch 98 at T4.

Figure 11:
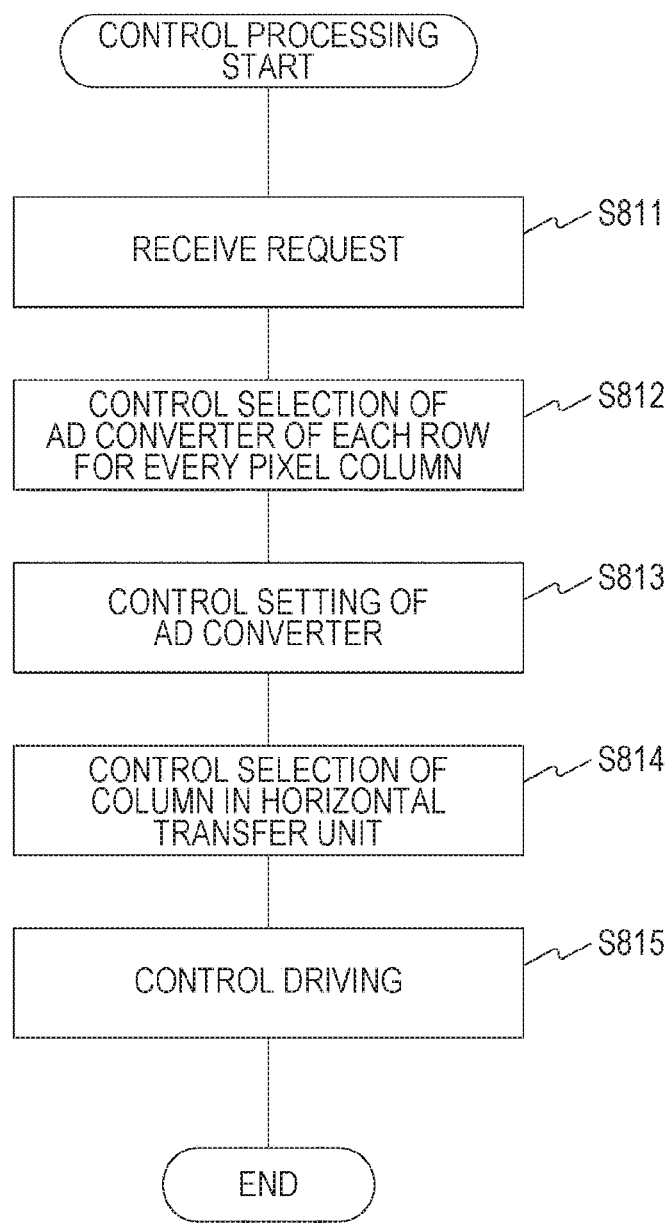
FIG. 11 is a flowchart illustrating an example of a control processing procedure of the imaging apparatus according to the first embodiment of the present technology.

FIG. 11 is a flowchart illustrating an example of a control processing procedure of the imaging apparatus according to the first embodiment of the present technology.

When control processing starts, the control unit 180 receives a request from outside (step S811). This request includes designation of a region in the pixel array 101.

The control unit 180 controls selection of the AD converter of each row for every pixel column in accordance with the received request (step S812). Therefore, switching of the switch 151 and the like in the row selection unit 150 is controlled, and the corresponding AD converter is selected.

Furthermore, the control unit 180 controls the AD converter to control setting of each column ADC (step S813).

Then, the control unit 180 controls the column selection unit 190 to control selection of columns in the horizontal transfer units 191 and 192 (step S814).

Then, the control unit 180 controls driving of each unit by controlling the pixel array 101, the row selection unit 150, the constant current circuit 160, the AD conversion unit 170, and the column selection unit 190 (step S815).

When reading of the pixel signal ends, the control unit 180 ends the control processing.

[Effect]

As described above, according to the first embodiment of the present technology, reading can be controlled for every partial region in the pixel array 101. That is, an exposure time, gain setting, a frame rate, output timing, and the like can be independently controlled for every region of interest (ROI).

2. Second Embodiment

In the first embodiment described above, a switch is individually and separately provided for each row of the pixel column to select the ADC. In that case, the switch is required for the number corresponding to the number of rows. Furthermore, in the first embodiment described above, the column selection switch configured to select a pixel column is provided. In this case, inputs corresponding to the number of pixel columns are required. Therefore, in a second embodiment, units of processing in a row or a column are grouped into a plurality of pixels to simplify a circuit. Note that an overall configuration of an imaging apparatus is similar to that of the first embodiment described above, and thus detailed description is omitted.

Figure 12:
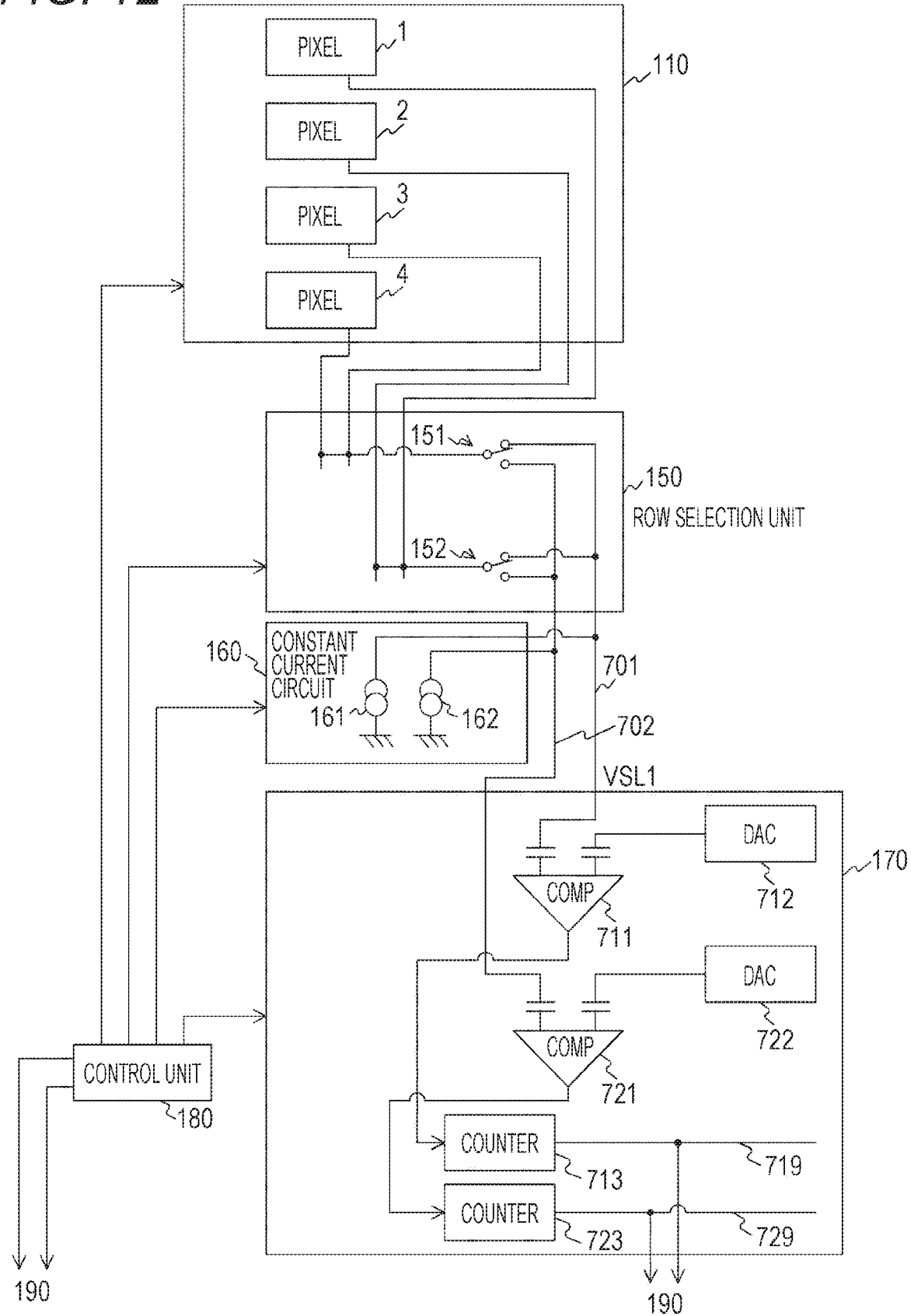
FIG. 12 is a diagram illustrating a configuration example of a unit column of an imaging apparatus according to a second embodiment of the present technology.

FIG. 12 is a diagram illustrating a configuration example of a unit column of the imaging apparatus according to the second embodiment of the present technology.

A row selection unit 150 according to the second embodiment includes switches 151 and 152. To the switch 151, pixel signals from pixels 3 and 4 in a pixel column 110 are inputted. Then, the switch 151 performs switching so as to connect pixel signals from the pixels 3 and 4 to any of vertical signal lines 701 and 702. Similarly, to the switch 152, pixel signals from pixels 1 and 2 in the pixel column 110 are input. Then, the switch 152 performs switching so as to connect pixel signals from the pixels 1 and 2 to any of the vertical signal lines 701 and 702.

That is, in this second embodiment, each of the switches 151 and 152 in the row selection unit 150 is individually shared by two pixels, and it is possible to reduce the number of switches 151 and 152 as compared with the first embodiment described above.

Note that a pixel array 101, a constant current circuit 160, and an AD conversion unit 170 other than the row selection unit 150 are similar to those in the first embodiment described above.

Figure 13:
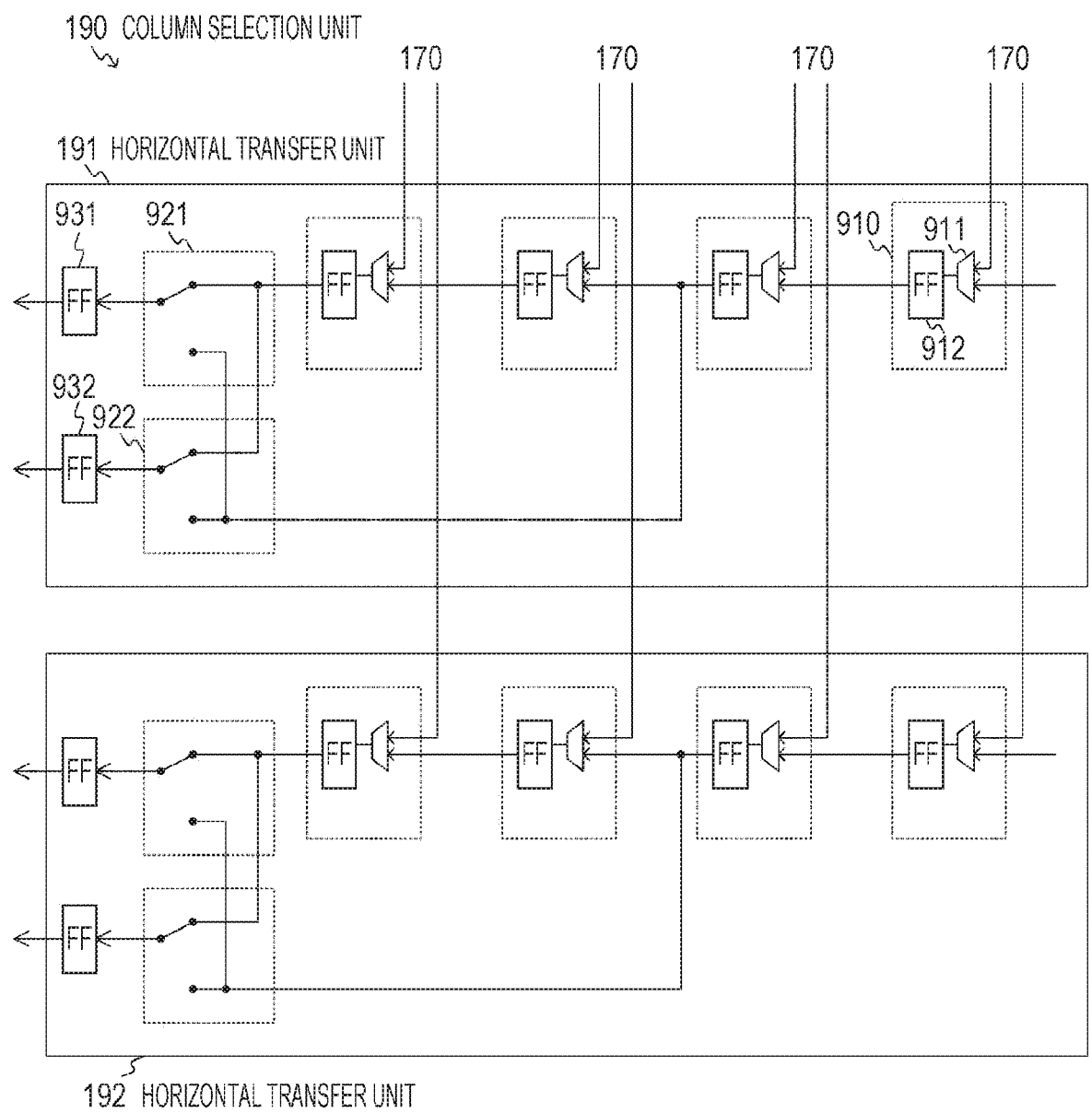
FIG. 13 is a diagram illustrating a configuration example of a column selection unit 190 according to the second embodiment of the present technology.

FIG. 13 is a diagram illustrating a configuration example of a column selection unit 190 according to the second embodiment of the present technology.

In each of horizontal transfer units 191 or 192, column selection switches 921 and 922 in this second embodiment select a pixel signal held by a pixel signal holding unit 910 that goes back every other stage from a final stage of the corresponding pixel signal holding unit 910. That is, while the pixel signals held by all pixel signal holding units 910 are inputs in the first embodiment described above, half of pixel signals held by the pixel signal holding units 910 are inputs in the second embodiment. Therefore, the number of inputs to the column selection switches 921 and 922 can be reduced to half as compared with the first embodiment described above.

As described above, according to the second embodiment of the present technology, a circuit scale of an imaging circuit can be simplified by performing control in units of two pixels for a row and a column.

3. Modified Example

In the embodiments described above, an example in which pixel signals are read out for one row at a time has been described, but a plurality of rows can be read out simultaneously. In the following modified examples, an example in which pixel signals are simultaneously read out for two rows will be described.

First Modified Example

Figure 14:
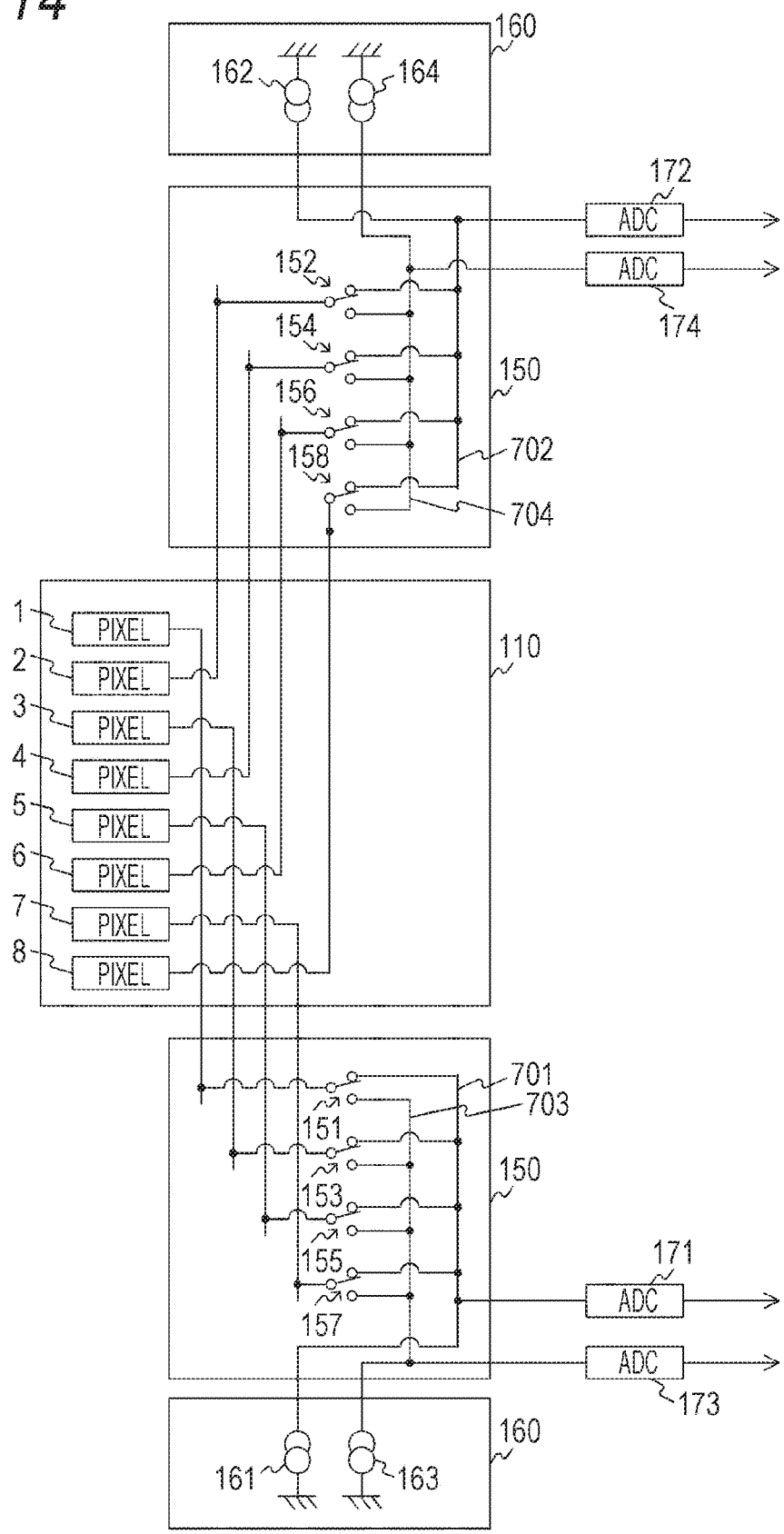
FIG. 14 is a diagram illustrating a configuration example of a unit column of an imaging apparatus according to a first modified example of the embodiment of the present technology.

FIG. 14 is a diagram illustrating a configuration example of a unit column of an imaging apparatus according to a first modified example of the embodiment of the present technology. This first modified example is for simultaneously reading out two rows in the first embodiment described above.

In this first modified example, pixel signals from pixels 1 to 8 in a pixel column 110 are inputted to switches 151 to 158 of a row selection unit 150.

The switches 151, 153, 155, and 157 are switches that perform switching so as to connect image signals from the pixel 1, the pixel 3, the pixel 5, and the pixel 7 to any of vertical signal lines 701 and 703. To the vertical signal lines 701 and 703, constant current sources 161 and 163 are connected, respectively. Furthermore, to the vertical signal lines 701 and 703, ADCs 171 and 173 are connected, respectively.

The switches 152, 154, 156, and 158 are switches that perform switching so as to connect image signals from the pixel 2, the pixel 4, the pixel 6, and the pixel 8 to any of vertical signal lines 702 and 704. To the vertical signal lines 702 and 704, constant current sources 162 and 164 are connected, respectively. Furthermore, to the vertical signal lines 702 and 704, ADCs 172 and 174 are connected, respectively.

As shown separately in upper and lower portions of the pixel column 110 in the same figure, the switches 151, 153, 155 and 157 can operate independently of the switches 152, 154, 156 and 158. Furthermore, the ADCs 171 and 173 can operate independently of the ADCs 172 and 174. Therefore, adjacent two rows of pixels in the pixel column 110 can be read simultaneously.

As described above, according to the first modified example of the present technology, it is possible to read out pixels at twice the speed as compared with the first embodiment described above.

Second Modified Example

Figure 15:
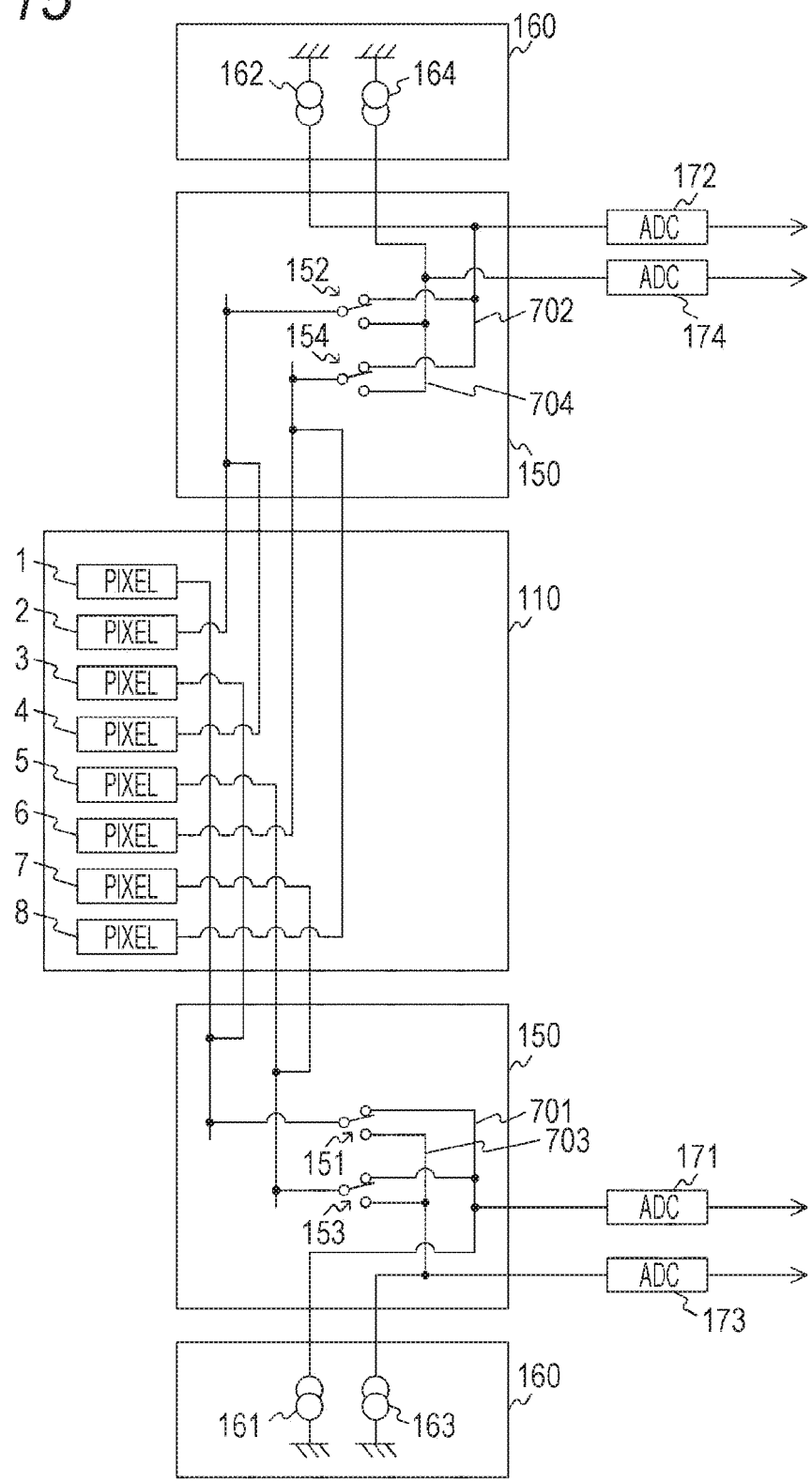
FIG. 15 is a diagram illustrating a configuration example of a unit column of an imaging apparatus according to a second modified example of the embodiment of the present technology.

FIG. 15 is a diagram illustrating a configuration example of a unit column of an imaging apparatus according to a second modified example of the embodiment of the present technology. This second modified example is for simultaneously reading out two rows in the second embodiment described above.

In this second modified example, pixel signals from pixels 1 to 8 in a pixel column 110 are inputted to switches 151 to 154 of a row selection unit 150.

The switch 151 is a switch that performs switching so as to connect an image signal from the pixel 1 or the pixel 3 to any of vertical signal lines 701 and 703. The switch 153 is a switch that performs switching so as to connect an image signal from the pixel 5 or the pixel 7 to any of the vertical signal lines 701 and 703. To the vertical signal lines 701 and 703, constant current sources 161 and 163 are connected, respectively. Furthermore, to the vertical signal lines 701 and 703, ADCs 171 and 173 are connected, respectively.

The switch 152 is a switch that performs switching so as to connect an image signal from the pixel 2 or the pixel 4 to any of vertical signal lines 702 and 704. The switch 154 is a switch that performs switching so as to connect an image signal from the pixel 6 or the pixel 8 to any of the vertical signal lines 702 and 704. To the vertical signal lines 702 and 704, constant current sources 162 and 164 are connected, respectively. Furthermore, to the vertical signal lines 702 and 704, ADCs 172 and 174 are connected, respectively.

As shown separately in upper and lower portions of the pixel column 110 in the same figure, the switches 151 and 153 can operate independently of the switches 152 and 154. Furthermore, the ADCs 171 and 173 can operate independently of the ADCs 172 and 174. Therefore, adjacent two rows of pixels in the pixel column 110 can be read simultaneously.

As described above, according to the second modified example of the present technology, it is possible to read out pixels at twice the speed as compared with the second embodiment described above.

4. Application Example

[Imaging System]

Figure 16:
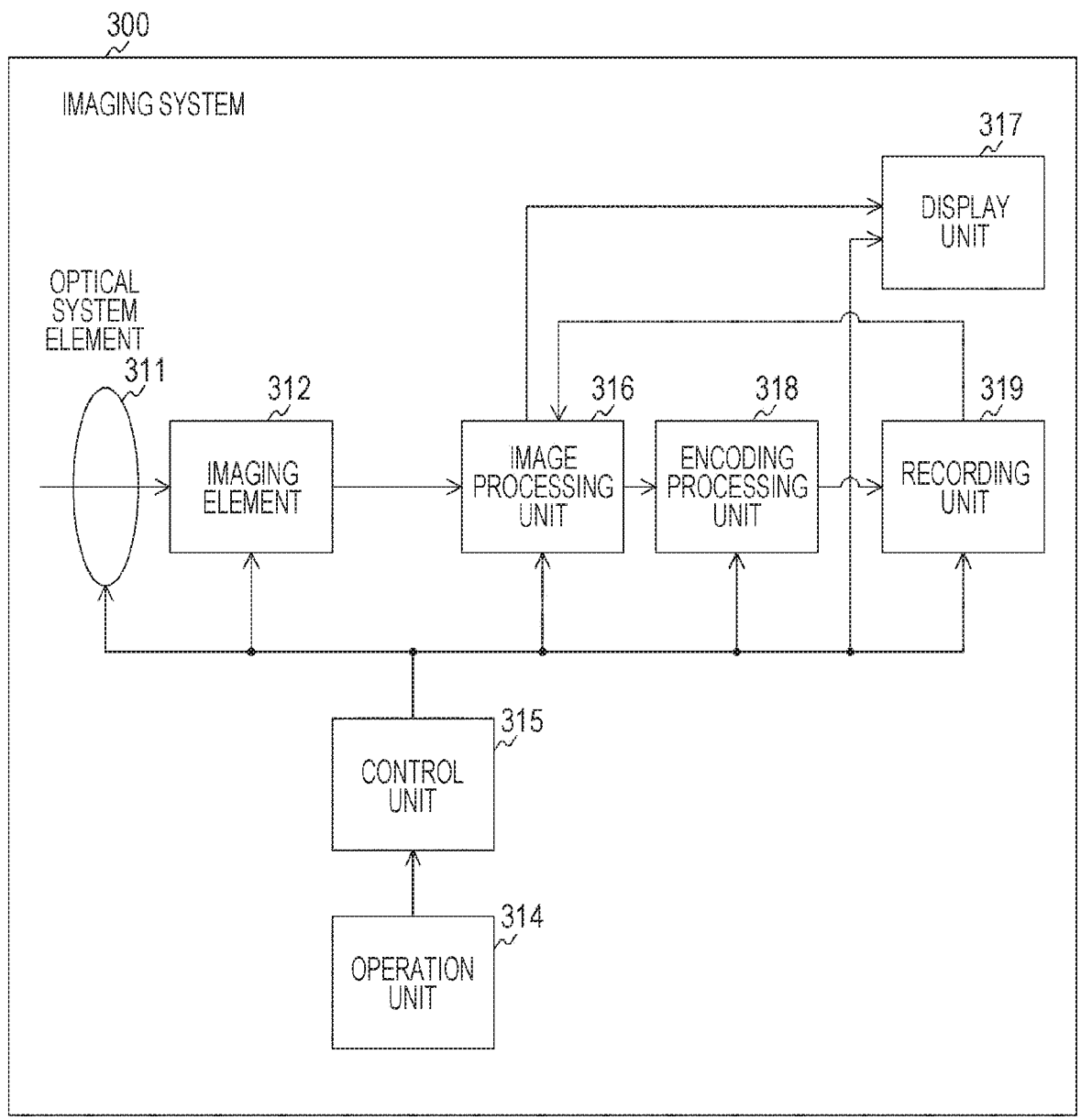
FIG. 16 is a diagram illustrating a specific configuration example of an imaging system that is an application example of the embodiment of the present technology.

FIG. 16 is a diagram illustrating a specific configuration example of an imaging system that is an application example of the embodiment of the present technology.

This imaging system 300 is a device configured to capture an image of a subject and output the image of the subject as an electric signal. This imaging system 300 includes an optical system element 311, an imaging element 312, an operation unit 314, a control unit 315, an image processing unit 316, a display unit 317, an encoding processing unit 318, and a recording unit 319.

The optical system element 311 includes a lens, an aperture, and the like. The optical system element 311 is controlled by the control unit 315 to adjust focus to the subject, collect light from the focused position, and supply to the imaging element 312.

The imaging element 312 is an image sensor configured to capture an image of a subject, and is controlled by the control unit 315 to photoelectrically convert incident light and perform AD conversion on a pixel value of each pixel, to obtain captured image data of the subject. The imaging element 312 is controlled by the control unit 315 to supply the captured image data obtained by the imaging to the image processing unit 316.

The operation unit 314 includes, for example, a jog dial (trademark), keys, buttons, a touch panel, or the like, and receives a user's operation input and outputs a signal corresponding to the operation input to the control unit 315.

On the basis of the signal corresponding to the user's operation input inputted by the operation unit 314, the control unit 315 controls driving of the optical system element 311, the imaging element 312, the image processing unit 316, the display unit 317, the encoding processing unit 318, and the recording unit 319, to cause each unit to perform processing related to imaging.

The image processing unit 316 applies, to an image signal supplied from the imaging element 312, various kinds of image processing such as, for example, black level correction, color mixture correction, defect correction, demosaic processing, matrix processing, gamma correction, and YC conversion. The content of the image processing is optional, and processing other than those described above may be performed. The image processing unit 316 supplies the image signal subjected to the image processing to the display unit 317 and the encoding processing unit 318.

The display unit 317 is configured as, for example, a liquid crystal display or the like, and displays an image of the subject on the basis of the image signal from the image processing unit 316.

The encoding processing unit 318 performs encoding processing of a predetermined method on the image signal from the image processing unit 316, and supplies image data obtained as a result of the encoding processing to the recording unit 319.

The recording unit 319 records the image data from the encoding processing unit 318. The image data recorded in the recording unit 319 is read out by the image processing unit 316 as needed and is supplied to the display unit 317, and a corresponding image is displayed.

The imaging element 312 has similar configuration to the imaging apparatus in the embodiment described above. That is, the imaging element 312 selects an ADC as an output destination of a pixel signal in the pixel column 110 by the row selection unit 150. Furthermore, a pixel signal from the pixel column 110 is selected by the column selection unit 190. Therefore, reading can be controlled for every partial region in the pixel array 101.

[Computer System]

The series of processes described above can be executed by hardware or also executed by software. In a case where the series of processes are performed by software, a program that configures the software is installed in a computer. Here, examples of the computer include, for example, a computer that is built in dedicated hardware such as the control unit 315 described above, a general-purpose personal computer that can perform various functions by being installed with various programs, and the like.

Figure 17:
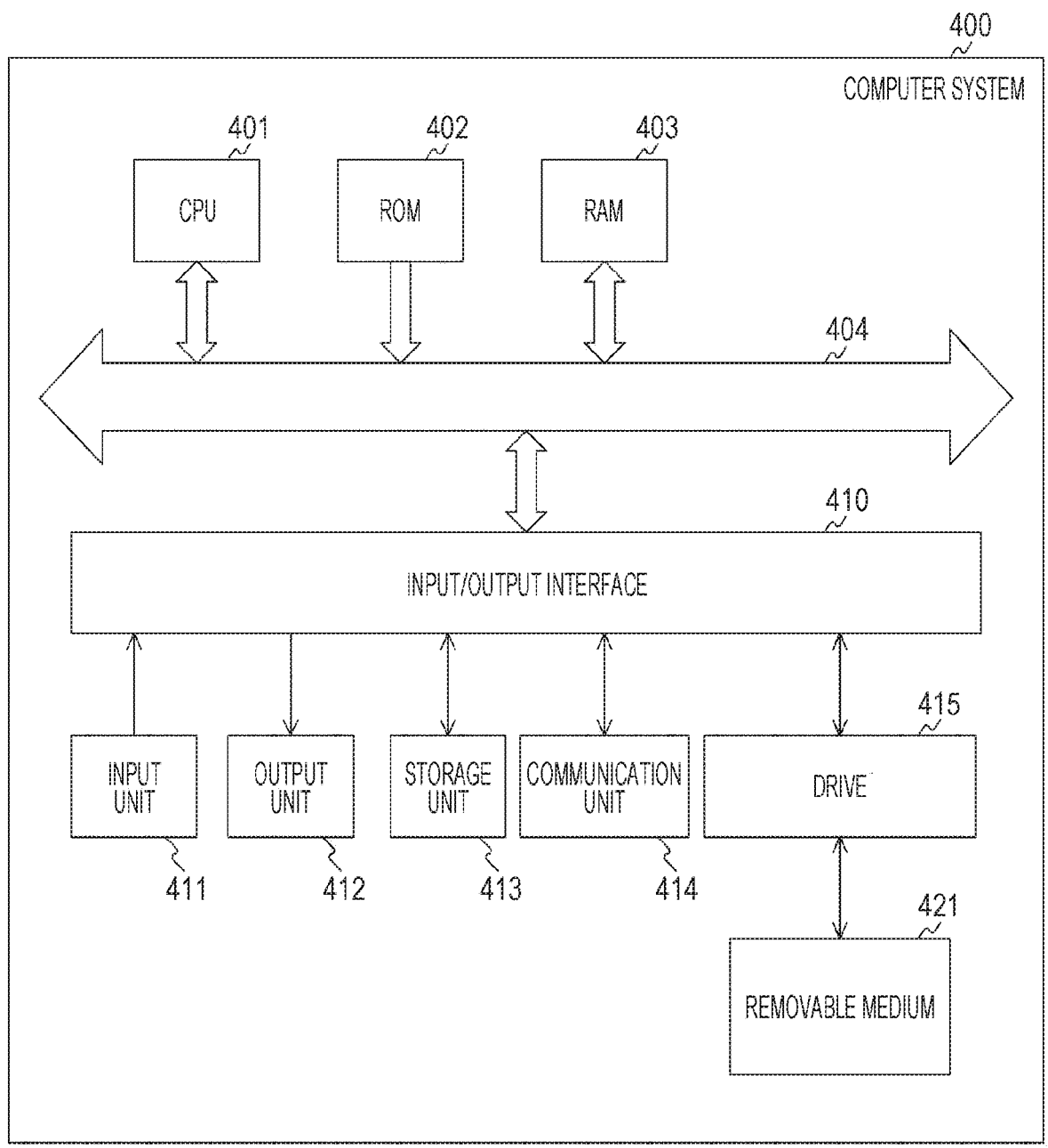
FIG. 17 is a diagram illustrating a specific configuration example of a computer system that is an application example of the embodiment of the present technology.

FIG. 17 is a diagram illustrating a specific configuration example of a computer system that is an application example of the embodiment of the present technology. A central processing unit (CPU) 401 of a computer system 400 executes the various kinds of processing in accordance with a program stored in a read only memory (ROM) 402, or a program loaded from a storage unit 413 into a random access memory (RAM) 403. Furthermore, the RAM 403 also stores data necessary for the CPU 401 to execute various kinds of processing, for example.

The CPU 401, the ROM 402, and the RAM 403 are mutually connected via a bus 404. This bus 404 is further connected with an input/output interface 410.

The input/output interface 410 is connected with an input unit 411 including a keyboard, a mouse, or the like, and an output unit 412 including a display including a cathode ray tube (CRT), liquid crystal display (LCD), or the like, a speaker, or the like. Furthermore, this input/output interface 410 is connected with the storage unit 413 including a hard disk or the like, and a communication unit 414 including a modem or the like. The communication unit 414 performs communication processing via a network including the Internet.

To the input/output interface 410, a drive 415 is also connected as required, and a removable medium 421 such as a magnetic disk, an optical disk, a magneto-optical disk, or a semiconductor memory is mounted as appropriate. Then, a computer program read therefrom is installed in the storage unit 413, as necessary.

In a case where the series of processes described above are executed by software, a program that configures the software is installed from a network or a recording medium.

This recording medium is configured by the removable medium 421, for example, that is distributed for distribution of the program to a user apart from the device itself, including a magnetic disk (including a flexible disk) in which the program is recorded, an optical disc (including a compact disc read only memory (CD-ROM) and a digital versatile disc (DVD)), a magneto-optical disc (including a MiniDisc (MD)), a semiconductor memory, or the like. Furthermore, this recording medium is configured by the ROM 402 that is distributed to the user in a state of being installed in advance in an apparatus main body and in which a program is recorded, a hard disk included in the storage unit 413, and the like.

Note that the embodiments described above are examples for embodying the present technology, and the matters in the embodiments and the matters used to specify the invention in the claims have a corresponding relationship. Similarly, the matters used to specify the invention in the claims and the matters in the embodiments of the present technology to which the same names are assigned have a corresponding relationship. However, the present technology is not limited to the embodiments, and can be embodied by applying various modifications to the embodiments without departing from the gist thereof.

Note that the effects described in this specification are merely examples and are not limited, and additional effects may be present.

Note that the present technology can also have the following configurations.

(1) An imaging apparatus including:

first and second pixels of an imaging element configured to capture an image of a subject;

first and second analog-to-digital converters configured to convert a pixel signal from the first and second pixels from an analog value to a digital value;

a first switch configured to supply a pixel signal from the first pixel to any one of the first and second analog-to-digital converters; and a second switch configured to supply a pixel signal from the second pixel to any one of the first and second analog-to-digital converters.

(2) The imaging apparatus according to (1), in which the first pixel corresponds to a first region, the second pixel corresponds to a second region that at least partially overlaps with the first region in a column direction, the first switch supplies a pixel signal of the first pixel to the first analog-to-digital converter, and the second switch supplies a pixel signal of the second pixel to the second analog-to-digital converter.

(3) The imaging apparatus according to (2), further including:
third and fourth pixels of the imaging element;
a third switch configured to supply a pixel signal from the third pixel to the first analog-to-digital converter in a case where the third pixel corresponds to the first region, and supply a pixel signal from the third pixel to the second analog-to-digital converter in a case where the third pixel corresponds to the second region; and
a fourth switch configured to supply a pixel signal from the fourth pixel to the first analog-to-digital converter in a case where the fourth pixel corresponds to the first region, and supply a pixel signal from the fourth pixel to the second analog-to-digital converter in a case where the fourth pixel corresponds to the second region.

(4) The imaging apparatus according to (3), further including a plurality of imaging circuits including the first to fourth pixels, the first and second analog-to-digital converters, and the first to fourth switches.

(5) The imaging apparatus according to (2), further including:
third and fourth pixels of the imaging element, in which
the first switch supplies a pixel signal from the third pixel to the first analog-to-digital converter in a case where the third pixel corresponds to the first region, and supplies a pixel signal from the third pixel to the second analog-to-digital converter in a case where the third pixel corresponds to the second region; and
the second switch supplies a pixel signal from the fourth pixel to the first analog-to-digital converter in a case where the fourth pixel corresponds to the first region, and supplies a pixel signal from the fourth pixel to the second analog-to-digital converter in a case where the fourth pixel corresponds to the second region.

(6) The imaging apparatus according to (5), further including a plurality of imaging circuits including the first to fourth pixels, the first and second analog-to-digital converters, and the first and second switches.

(7) The imaging apparatus according to any one of (1) to (6), further including:
a first flip-flop configured to hold a first digital signal outputted from the first analog-to-digital converter; and
a second flip-flop configured to hold a second digital signal outputted from the second analog-to-digital converter.

(8) The imaging apparatus according to (7), further including an output switch configured to select the first and second digital signals held by the first and second flip-flops to be outputted to any one of first and second output units.

(9) The imaging apparatus according to (8), in which
the first pixel corresponds to a first region,
the second pixel corresponds to a second region that at least partially overlaps with the first region in a column direction,
the first switch supplies a pixel signal of the first pixel to the first analog-to-digital converter,
the second switch supplies a pixel signal of the second pixel to the second analog-to-digital converter, and
the output switch outputs a first digital signal outputted from the first analog-to-digital converter to the first output unit, and outputs a second digital signal outputted from the second analog-to-digital converter to the second output unit

REFERENCE SIGNS LIST 1 to 44, 111 Pixel
51 to 54 Row selection unit
61 to 64, 71 to 74 AD converter (ADC)
81 to 84, 91 to 94 Flip-flop
88, 89, 98, 99 Column selection switch
101 Pixel array
110 Pixel column
112 Transfer transistor
113 Floating diffusion region
114 Reset transistor
115 Amplification transistor
116 Selection transistor
117 Photo diode
150 Row selection unit
151 to 158 Switch
160 Constant current circuit
161 to 164 Constant current source
170 AD conversion unit
171 to 174 AD converter (ADC)
180 Control unit
190 Column selection unit
191, 192 Horizontal transfer unit
701 to 704, 119 Vertical signal line
711, 721 Comparator
712, 722 DA converter
713, 723 Counter
910 Pixel signal holding unit
911 Input selector
912 Flip-flop
921, 922 Column selection switch
931, 932 Output holding unit

The invention claimed is:

1. An imaging apparatus, comprising:
a first pixel and a second pixel of an imaging element configured to capture an image of a subject, wherein
the first pixel corresponds to a first region, and
the second pixel corresponds to a second region that at least partially overlaps with the first region in a column direction;
a third pixel and a fourth pixel of the imaging element;
a first analog-to-digital converter and a second analog-to-digital converter configured to convert a pixel signal from the first pixel and the second pixel from an analog value to a digital value;
a first switch configured to supply a first pixel signal from the first pixel to the first analog-to-digital converter;
a second switch configured to supply a second pixel signal from the second pixel to the second analog-to-digital converter;
a third switch configured to:
supply a third pixel signal from the third pixel to the first analog-to-digital converter based on the third pixel that corresponds to the first region; and
supply the third pixel signal from the third pixel to the second analog-to-digital converter based on the third pixel that corresponds to the second region; and
a fourth switch configured to:
supply a fourth pixel signal from the fourth pixel to the first analog-to-digital converter based on the fourth pixel that corresponds to the first region; and
supply the fourth pixel signal from the fourth pixel to the second analog-to-digital converter based on the fourth pixel that corresponds to the second region.

2. The imaging apparatus according to claim 1, further comprising a plurality of imaging circuits that includes:
the first pixel, the second pixel, the third pixel, and the fourth pixel,
the first analog-to-digital converter and the second analog-to-digital converter, and the first switch, the second switch, the third switch and the fourth switch.

3. The imaging apparatus according to claim 1, further comprising:
a first flip-flop configured to hold a first digital signal outputted from the first analog-to-digital converter; and
a second flip-flop configured to hold a second digital signal outputted from the second analog-to-digital converter.

4. The imaging apparatus according to claim 3 further comprising
an output switch configured to select the first digital signal and the second digital signal held by the first flip-flop and the second flip-flop to be outputted to any one of a first output unit and second output unit.

5. The imaging apparatus according to claim 4, wherein
the first pixel corresponds to the first region,
the second pixel corresponds to the second region,
the first switch is further configured to supply the first pixel signal of the first pixel to the first analog-to-digital converter,
the second switch is further configured to supply the second pixel signal of the second pixel to the second analog-to-digital converter, and
the output switch is further configured to:
output the first digital signal outputted from the first analog-to-digital converter to the first output unit; and
output the second digital signal outputted from the second analog-to-digital converter to the second output unit.

6. An imaging apparatus, comprising:
a first pixel and a second pixel of an imaging element configured to capture an image of a subject, wherein
the first pixel corresponds to a first region, and
the second pixel corresponds to a second region that at least partially overlaps with the first region in a column direction;
a third pixel and a fourth pixel of the imaging element;
a first analog-to-digital converter and a second analog-to-digital converter configured to convert a pixel signal from the first pixel and the second pixel from an analog value to a digital value;
a first switch configured to:
supply a first pixel signal from the first pixel to the first analog-to-digital converter;
supply a third pixel signal from the third pixel to the first analog-to-digital converter based on the third pixel that corresponds to the first region; and
supply the third pixel signal from the third pixel to the second analog-to-digital converter based on the third pixel that corresponds to the second region; and
a second switch configured to:
supply a second pixel signal from the second pixel to the second analog-to-digital converter;
supply a fourth pixel signal from the fourth pixel to the first analog-to-digital converter based on the fourth pixel that corresponds to the first region; and
supply the fourth pixel signal from the fourth pixel to the second analog-to-digital converter based on the fourth pixel that corresponds to the second region.

7. The imaging apparatus according to claim 6, further comprising a plurality of imaging circuits that includes:
the first pixel, the second pixel, the third pixel, and the fourth pixel,
the first analog-to-digital converter and the second analog-to-digital converter, and
the first switch and the second switch.

* * * * *